(12) United States Patent
Lee

(10) Patent No.: US 11,784,178 B2
(45) Date of Patent: *Oct. 10, 2023

(54) SEMICONDUCTOR MEMORY DEVICE AND MANUFACTURING METHOD OF SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/832,993

(22) Filed: Jun. 6, 2022

(65) Prior Publication Data

US 2022/0302099 A1   Sep. 22, 2022

Related U.S. Application Data

(62) Division of application No. 17/166,711, filed on Feb. 3, 2021, now Pat. No. 11,380,668.

(30) Foreign Application Priority Data

Aug. 3, 2020 (KR) .................. 10-2020-0097011

(51) Int. Cl.
*H01L 25/18* (2023.01)
*G11C 16/24* (2006.01)
(Continued)

(52) U.S. Cl.
CPC .............. *H01L 25/18* (2013.01); *G11C 16/08* (2013.01); *G11C 16/24* (2013.01); *H01L 24/20* (2013.01);
(Continued)

(58) Field of Classification Search
CPC ... H01L 25/18; H01L 24/20; H01L 27/11519; H01L 27/11524; H01L 27/11529;
(Continued)

(56) References Cited

U.S. PATENT DOCUMENTS 10,510,738 B2   12/2019   Kim et al.
11,024,636 B1   6/2021   Leobandung
(Continued)

FOREIGN PATENT DOCUMENTS

CN   107393583 A   11/2017
CN   108063142 A   5/2018
(Continued)

*Primary Examiner* — Fernando Hidalgo
(74) *Attorney, Agent, or Firm* — WILLIAM PARK & ASSOCIATES LTD.

(57) ABSTRACT

A semiconductor device includes: a substrate extending in a first direction and a second direction intersecting with the first direction; a plurality of input/output pads disposed at one side of the substrate; a first circuit adjacent to the input/output pads in the first direction; a second circuit disposed to be spaced farther apart from the input/output pads in the first direction than the first circuit; a first memory cell array overlapping the first circuit; a second memory cell array overlapping the second circuit; first metal source patterns overlapping the first memory cell array and being spaced apart from each other in the second direction; and a second metal source pattern overlapping the second memory cell array and formed to have a width wider than a width of each of the first metal source patterns in the second direction.

5 Claims, 21 Drawing Sheets

(51) Int. Cl.
*G11C 16/08* (2006.01)
*H01L 23/00* (2006.01)
*H10B 41/10* (2023.01)
*H10B 41/27* (2023.01)
*H10B 41/35* (2023.01)
*H10B 41/41* (2023.01)
*H10B 43/10* (2023.01)
*H10B 43/27* (2023.01)
*H10B 43/35* (2023.01)
*H10B 43/40* (2023.01)

(52) U.S. Cl.
CPC ............. *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02); *H01L 2924/1431* (2013.01); *H01L 2924/1438* (2013.01)

(58) Field of Classification Search
CPC ......... H01L 27/11556; H01L 27/11565; H01L 27/1157; H01L 27/11573; H01L 27/11582; H01L 2924/1431; H01L 2924/1438; H01L 24/08; H01L 2224/08058; H01L 2224/08145; H01L 2224/80357; H01L 2224/80896; H01L 2225/06527; H01L 25/0657; H01L 2224/80895; H01L 27/11551; H01L 27/11578; H01L 27/11575; H01L 2224/05556; H10B 41/10; H10B 41/27; H10B 41/35; H10B 41/41; H10B 43/10; H10B 43/27; H10B 43/35; H10B 43/40; H10B 41/20; H10B 43/20; H10B 43/50; G11C 16/08; G11C 16/24; G11C 5/025; G11C 16/0483; G11C 5/063; G11C 5/147
USPC .................................................. 365/185.17
See application file for complete search history.

(56) References Cited

U.S. PATENT DOCUMENTS

| | | | |
|---|---|---|---|
| 11,380,668 B2 * | 7/2022 | Lee | ................. G11C 16/24 |
| 2014/0061776 A1 | 3/2014 | Kwon et al. | |
| 2015/0318301 A1 | 11/2015 | Lee et al. | |
| 2016/0141419 A1 | 5/2016 | Baenninger et al. | |
| 2019/0043868 A1 | 2/2019 | Hasnat et al. | |
| 2019/0081065 A1 | 3/2019 | Lee | |
| 2019/0164983 A1 | 5/2019 | Hu et al. | |
| 2020/0135751 A1 | 4/2020 | Liu et al. | |
| 2021/0057020 A1 | 2/2021 | Tanaka | |
| 2021/0090983 A1 | 3/2021 | Lin et al. | |
| 2021/0151462 A1 | 5/2021 | Baek | |
| 2021/0193790 A1 | 6/2021 | Hu et al. | |
| 2021/0210505 A1 * | 7/2021 | Choi | ............... H01L 27/11526 |
| 2021/0320118 A1 | 10/2021 | Zhang et al. | |
| 2021/0327892 A1 * | 10/2021 | Jung | ............... H01L 27/11582 |
| 2022/0246631 A1 * | 8/2022 | Akutsu | ............... H01L 21/743 |
| 2022/0344363 A1 * | 10/2022 | Lee | ................. H10B 43/27 |

FOREIGN PATENT DOCUMENTS

| | | | | |
|---|---|---|---|---|
| CN | 108242444 A | 7/2018 | | |
| CN | 109273453 A | 1/2019 | | |
| CN | 109509756 A | 3/2019 | | |
| CN | 109686739 A | 4/2019 | | |
| KR | 1020110128717 A | 11/2011 | | |
| KR | 1020140076799 A | 6/2014 | | |
| KR | 1020190111179 A | 10/2019 | | |
| WO | WO-2016007315 A1 * | 1/2016 | ......... H01L 21/8239 | |

\* cited by examiner

SEMICONDUCTOR MEMORY DEVICE AND MANUFACTURING METHOD OF SEMICONDUCTOR MEMORY DEVICE

CROSS-REFERENCE TO RELATED APPLICATION

The present application is a divisional application of U.S. patent application Ser. No. 17/166,711, filed on Feb. 3, 2021, and claims priority under 35 U.S.C. § 119(a) to Korean patent application number 10-2020-0097011, filed on Aug. 3, 2020, in the Korean Intellectual Property Office, the entire disclosure of which is incorporated herein by reference.

BACKGROUND

1. Technical Field

The present disclosure may generally relate to a semiconductor memory device and a manufacturing method of a semiconductor memory device, and more particularly, to a three-dimensional semiconductor memory device and a manufacturing method of a three-dimensional semiconductor memory device.

2. Related Art

A semiconductor memory device includes memory cells capable of storing data. A three-dimensional semiconductor memory device includes three-dimensionally arranged memory cells, so that an area occupied by memory cells per unit area of a substrate can be reduced.

In the three-dimensional semiconductor memory device, the degree of arrangement freedom of lines for controlling an operation of memory cells may be limited by various causes.

SUMMARY

In an embodiment of the present disclosure, a semiconductor memory device includes: a substrate extending in a first direction and a second direction intersecting with the first direction; a plurality of input/output pads disposed at one side of the substrate; a first circuit adjacent to the input/output pads in the first direction; a second circuit disposed to be spaced farther apart from the input/output pads in the first direction than the first circuit; a first memory cell array overlapping the first circuit; a second memory cell array overlapping the second circuit; first metal source patterns overlapping the first memory cell array, wherein the first metal source patterns are spaced apart from each other in the second direction; and a second metal source pattern overlapping the second memory cell array, wherein the second metal source pattern has a width wider than a width of each of the first metal source patterns in the second direction.

In an embodiment of the present disclosure, a semiconductor memory device includes: a bit line; a common source line overlapping the bit line; a gate stack structure including interlayer insulating layers and conductive patterns, which are alternately stacked between the bit line and the common source line; a channel structure penetrating the gate stack structure, wherein the channel structure extends to be in direct contact with the common source line; and a memory pattern disposed between the channel structure and the gate stack structure, wherein the common source line includes a conductive material having a resistivity lower than that of silicon and being in direct contact with the channel structure.

In an embodiment of the present disclosure, a method of manufacturing a semiconductor memory device includes: forming a memory cell array on a sacrificial substrate, wherein the memory cell array includes interlayer insulating layers and conductive patterns, which are alternately stacked on the sacrificial substrate, a channel structure penetrating the interlayer insulating layers and the conductive patterns, and a memory layer extending along a surface of the channel structure; removing the sacrificial substrate to expose the memory layer; removing a portion of the memory layer to expose a first end portion of the channel structure; and forming a common source line at a temperature of 450° C. or less, wherein the common source line is in direct contact with the first end portion of the channel structure, and extends to overlap the memory cell array.

BRIEF DESCRIPTION OF THE DRAWINGS

Example embodiments will now be described more fully hereinafter with reference to the accompanying drawings; however, they may be embodied in different forms and should not be construed as being limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout the drawings.

DETAILED DESCRIPTION

Specific structural or functional descriptions disclosed herein are merely illustrative for the purpose of describing embodiments according to the concept of the present disclosure. The embodiments according to the concept of the present disclosure can be implemented in various forms, and should not be construed as being limited to the specific embodiments set forth herein.

Hereinafter, the terms 'first' and 'second' are used to distinguish one component from another component and not used to in imply a particular number of sequence of components. The terms may be used to describe various components, but the components are not limited by the terms.

Embodiments provide a semiconductor memory device and a manufacturing method of a semiconductor memory device, which can improve the degree of arrangement freedom of lines.

Figure 1:
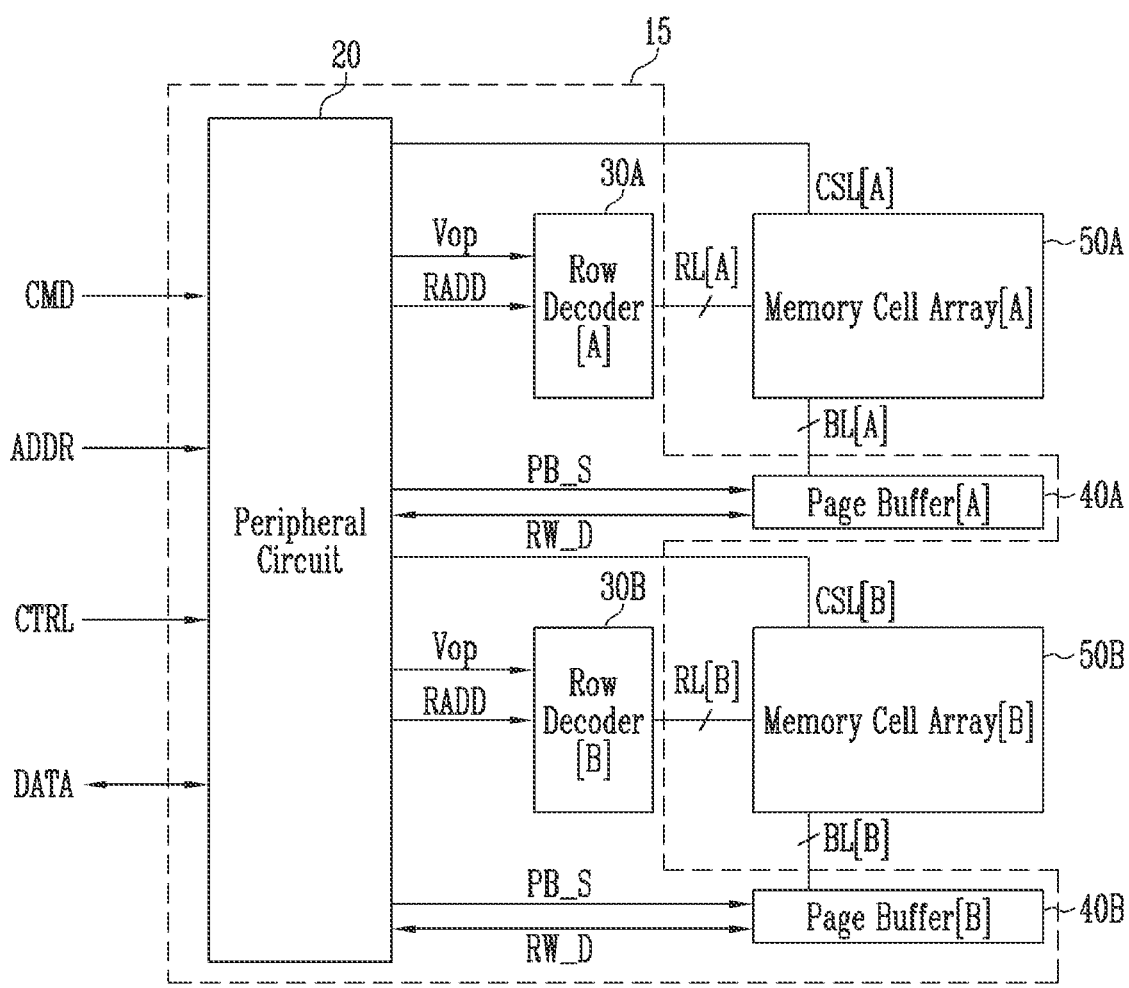
FIG. 1 is a block diagram illustrating a semiconductor memory device in accordance with an embodiment of the present disclosure.

FIG. 1 is a block diagram illustrating a semiconductor memory device 10 in accordance with an embodiment of the present disclosure.

Referring to FIG. 1, the semiconductor memory device 10 may be formed in a multi-plane structure including two or more planes of which individual operations can be simultaneously controlled. In an embodiment, the semiconductor memory device 10 may include a first memory cell array 50A included in a first plane, a second memory cell array 50B included in a second plane, and a circuit group 15 configured to control various operations of the first memory cell array 50A and the second memory cell array 50B, For convenience of description, FIG. exemplifies a 2-plane structure, but the present disclosure is not limited thereto. Other embodiments may include more than two planes.

Each of the first memory cell array 50A and the second memory cell array 50B may include a plurality of memory blocks. The memory blocks may include a plurality of cell strings. Each cell string may include a plurality of memory cells connected in series. Each memory cell may store one-bit data or multi-bit data of two or more bits. The memory cells may be a nonvolatile memory cells. In an embodiment, the memory cells may be a NAND flash memory cells.

The first memory cell array 50A may be accessed by a plurality of first local lines RL[A], a first common source line CSL[A], and a plurality of first bit lines BL[A]. The second memory cell array 50B may be accessed by a plurality of second local lines RL[B], a second common source line CSL[B], and a plurality of second bit lines BL[B].

The circuit group 15 may include a first row decoder 30A, a first page buffer 40A, a second row decoder 30B, a second page buffer 40B, and a peripheral circuit 20.

The first memory cell array 50A may be connected to the first row decoder 30A through the plurality of first local lines RL[A], be connected to the first page buffer 40A through the plurality of first bit lines BL[A], and be connected to the peripheral circuit 20 through the first common source line CSL[A]. The second memory cell array 50B may be connected to the second row decoder 303 through the plurality of second local lines RL[B], be connected to the second page buffer 40B through the plurality of second bit lines BL[B], and be connected to the peripheral circuit 20 through the second common source line CSL[B].

The peripheral circuit 20 may receive a command signal CMD, an address signal ADDR, and a control signal CTRL from an external device at the outside of the semiconductor memory device 10, and communicate data DATA with the external device.

The peripheral circuit 20 may output various signals for performing a program operation, a read operation, and an erase operation in of the first memory cell array 50A and the second memory cell array 50B in response to the command signal CMD, the address signal ADDR, and the control signal CTRL.

The peripheral circuit 20 may include control logic which outputs a row address RADD, page buffer control signal PB_S, and a column address in response to the address signal ADDR and the command signal CMD. The peripheral circuit 20 may include an operation voltage generating circuit which outputs operation voltages Vop in response to the address signal ADDR and the command signal CMD. The peripheral circuit 20 may include a column decoder which exchanges data signals RW_D with the first page buffer 40A and the second page buffer 40B in response to the column address. The peripheral circuit 20 may include an input/output circuit which exchanges the data DATA with the column decoder. The peripheral circuit 20 may include a source discharge circuit which controls discharge of the first common source line CSL[A] and the second common source line CSL[B].

Each of the first row decoder 30A and the second row decoder 30B may transfer various operation voltages Vop generated from the peripheral circuit 20 to the first memory cell array 50A and the second memory cell array 50B in response to the row address RADD received from the peripheral circuit 20.

The first page buffer 40A and the second page buffer 40B may detect data stored in the first memory cell array 50A and the second memory cell array 50B in response to page buffer control signals PB_S output from the peripheral circuit 20, and transmit the detected data as the data signals RW_D to the peripheral circuit 20. The first page buffer 40A and the second page buffer 40B may write data to the first memory cell array 50A and the second memory cell array 50B, based on the data signals RW_D received from the peripheral circuit 20.

The first common source line CSL[A] and the second common source line CSL[B] may be discharged under the control of the peripheral circuit 20, or be applied with a source voltage.

As described above, the peripheral circuit 20 may include a plurality of sub-circuits such as the control circuit, the operation voltage generating circuit, the column decoder, the input/output circuit, the source discharge circuit, and an internal voltage generating circuit so as to control various operations of the first memory cell array 50A and the second memory cell array 50B. The arrangement of the sub-circuits may be various.

In order to efficiently use a limited area, the first memory cell array 50A and the second memory cell array 50B may overlap a substrate including the circuit group 15.

Figure 2:
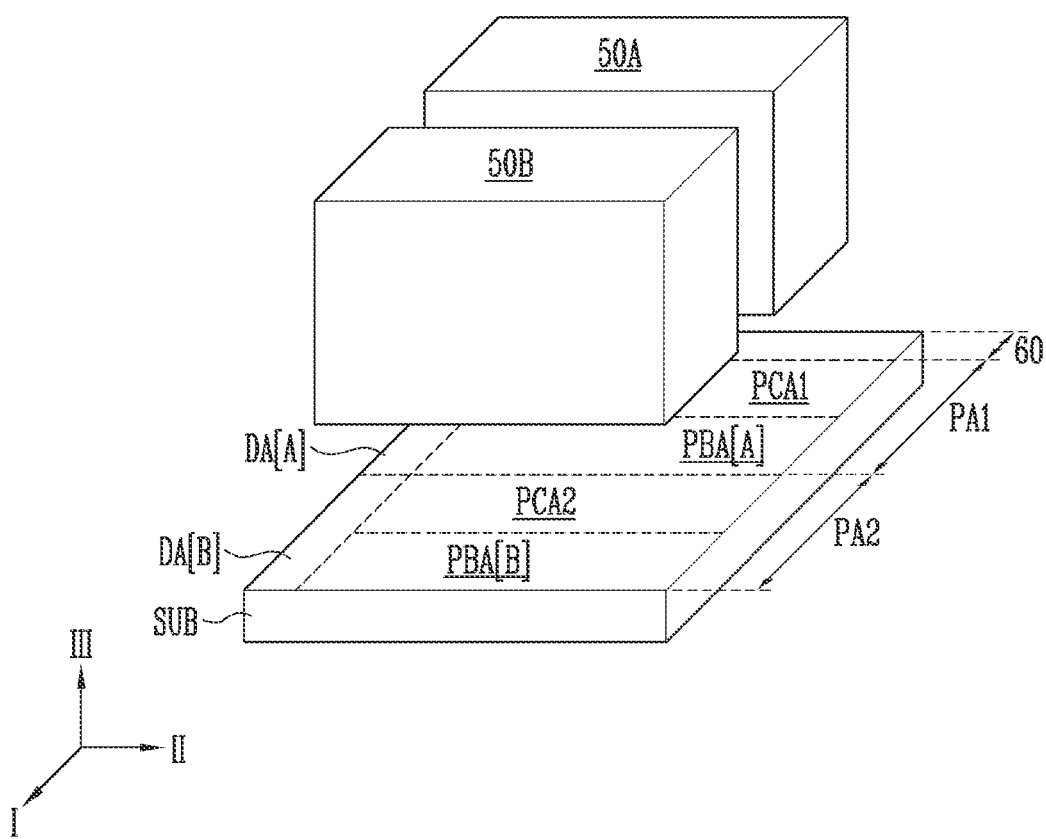
FIG. 2 illustrates a substrate overlapped by first and second memory cell arrays in accordance with an embodiment of the present disclosure.

FIG. 2 illustrates a substrate SUB overlapped by first and second memory cell arrays 50A and 50B in accordance with an embodiment of the present disclosure. The first memory cell array 50A and the second memory cell array 50B shown in FIG. 2 may respectively correspond to the first memory cell array and the second memory cell array described with reference to FIG. 1.

Referring to FIG. 2, the substrate SUB may extend in a first direction I and a second direction II. The first direction I and the second direction II may be intersecting directions, meaning they are not parallel. In an embodiment, the first direction I and the second direction II may respectively correspond to directions in which an X-axis and a Y-axis face in an XYZ Cartesian coordinate system, Hereinafter, a direction intersecting a plane extending in the first direction I and the second direction II is defined as a third direction III. The third direction III may correspond to a direction in which a Z-axis faces in the XYZ Cartesian coordinate system.

The substrate SUB may include an n-type impurity and a p-type impurity, which are used for the circuit group 15 described with reference to FIG. 1. The substrate SUB may include a pad region 60, a first circuit region PA1, and a second circuit region PA2.

The pad region 60 may be defined at one side of the substrate SUB, and be provided as a region for a plurality of input/output pads.

The first circuit region PA1 may be adjacent to the pad region 60 in the first direction I. The first circuit region PA1 may include a first row decoder region DA[A], a first peripheral circuit region PCA1, and a first page buffer region PBA[A]. The first peripheral circuit region PCA1 and the first page buffer region PBA[A] may be adjacent to each other in the first direction I. The first peripheral circuit region PCA1 may be disposed between the pad region 60 and the first page buffer region PBA[A]. Each of the first peripheral circuit region PCA1 and the first page buffer region PBA[A] may be adjacent to the first row decoder region DA[A] in the second direction II. The first row decoder region DA[A] may extend in the first direction I to face the first peripheral circuit region PCA1 and the first page buffer region PBA[A].

The second circuit region PA2 may be spaced farther apart from the pad region 60 in the first direction T than the first circuit region PA1. In other words, the first circuit region PA1 may be disposed between the pad region 60 and the second circuit region PA2. The second circuit region PA2 may include a second row decoder region DA[B], a second peripheral circuit region PCA2, and a second page buffer region PBA[B]. The second peripheral circuit region PCA2 and the second page buffer region PBA[B] may be adjacent to each other in the first direction I. The second peripheral circuit region PCA2 may be disposed between the first page buffer region PBA[A] and the second page buffer region PBA[B]. The second row decoder region DA[B] may be adjacent to the first row decoder region DA[A] in the first direction I. The second row decoder region DA[B] may extend in the first direction I to face the second peripheral circuit region PCA2 and the second page buffer region PBA[B].

The first memory cell array 50A may overlap the first circuit region PA1, and the second memory cell array 50B may overlap the second circuit region PA2. A portion of each of the first circuit region PA1 and the second circuit region PA2 is not overlapped by the first memory cell array 50A and the second memory cell array 50B, but may be open. In an embodiment, one side of the first circuit region PA1, which is adjacent to the pad region 60, the other side of the first circuit region PA1, which is adjacent to the second circuit region PA2, and one side of the second circuit region PA2, which is adjacent to the first circuit region PA1, may not be overlapped by the first memory cell array 50A and the second memory cell array 50B.

The first row decoder region DA[A] may be provided as a region in which the first row decoder 30A described with reference to FIG. 1 is disposed, and the second row decoder region DA[B] may be provided as a region in which the second row decoder 30B described with reference to FIG. 1 is disposed. The first page buffer region PBA[A] may be provided as a region in which the first page buffer 40A described with reference to FIG. 1 is disposed, and the second page buffer region PBA[B] may be provided as a region in which the second page buffer 40B described with reference to FIG. 1 is disposed.

The first peripheral circuit region PCA1 and the second peripheral circuit region PCA2 may be provided as a region in which the peripheral circuit 20 shown in FIG. 1 is disposed. The peripheral circuit 20 may include sub-circuits except the first and second page buffers 40A and 40B and the first and second row decoders 30A and 30B, which are shown in FIG. 1. The sub-circuits may be distributed and disposed in the first peripheral circuit region PCA1 and the second peripheral circuit region PCA2.

Some of the sub-circuits, which require a high-speed operation and require minimization of voltage drops, may be disposed in in the first peripheral circuit region PCA1. In an embodiment, a control circuit, an operation voltage generating circuit, and an internal voltage generating circuit may be disposed in the first peripheral circuit region PCA1. The control circuit may output various signals for controlling the first row decoder 30A, the second row decoder 30B, the first page buffer 40A, the second page buffer 40B, and the like, which are described with reference to FIG. 1, in response to the command signal CMD and the address signal ADDR, which are described with reference to FIG. 1. The operation voltage generating circuit may include a pump circuit and regulators, and may generate high voltages to program or erase memory cells of the first memory cell array 50A and the second memory cell array 50B. The internal voltage generation circuit may generate reference voltages, internal power voltages, and internal ground voltages, which are for an operation of the semiconductor memory device.

Some of the others of the sub-circuits, which are not disposed in the first peripheral circuit region PCA1 but remain, may be disposed in the second peripheral circuit region PCA2. In an embodiment, a source discharge circuit and an input/output circuit may be disposed in the second peripheral circuit region PCA2. The source discharge circuit may be accessed to the first memory cell array 50A by the first common source line CSL[A] shown in FIG. 1, and be accessed to the second memory cell array 50B by the second common source line CSL[B] shown in FIG. 1. The source discharge circuit may include transistors which individually control the first common source line CSL[A] and the second common source line CSL[B], which are shown in FIG. 1 The input/output circuit may communicate data with an external device.

The structure in which the sub-circuits are distributed and disposed is not limited to the above-described embodiment, and may be variously designed by considering electrical characteristics of the sub-circuits and arrangement of lines connected to the sub-circuits.

Figure 3:
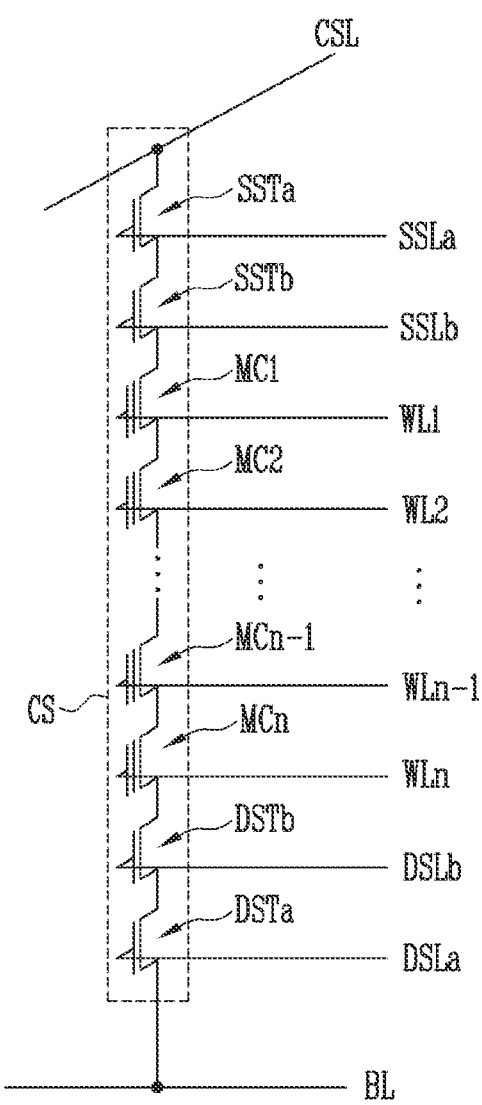
FIG. 3 is a circuit diagram illustrating a cell string in accordance with an embodiment of the present disclosure.

FIG. 3 is a circuit diagram illustrating a cell string CS in accordance with an embodiment of the present disclosure. Each of the first memory cell array 50A and the second memory cell array 50B shown in FIGS. 1 and 2 may include the cell string CS shown in FIG. 3.

Referring to FIG. 3, the cell string CS may be connected between a common source line CSL and a bit line BL.

The cell string CS may be controlled by local lines SSLa, SSLb, WL1 to WLn, DSLa, and DSLb. The local lines SSLa, SSLb, WL1 to WLn, DSLa, and DSLb may include one or more source select lines SSLa and SSLb, a plurality of word lines WL1 to WLn, and one or more drain select lines DSLa and DSLb. The cell string CS may include a plurality of memory cells MC1 to MCn, one or more source select transistors SSTa and SSTb, and one or more drain select transistors DSTa and DSTb.

The plurality of memory cells MC1 to MCn may be connected in series. Gates of the plurality of memory cells MC1 to MCn may be spaced apart from each other to be respectively connected to the stacked word lines WL1 to WLn.

The one or more source select transistors SSTa and SSTb may control electrical connection between the plurality of memory cells MC1 to MCn and the common source line CSL. In an embodiment, the cell string CS may include one source select transistor SSTa disposed between the common source line CSL and the plurality of memory cells MC1 to MCn. However, the present disclosure is not limited thereto. In an embodiment, the cell string CS may include two or more source select transistors SSTa and SSTb which are disposed between the common source line CSL and the plurality of memory cells MC1 to MCn, and are connected in series to each other. Gates of the source select transistors SSTa and SSTb may be respectively connected to the source select lines SSLa and SSW.

The one or more drain select transistors DSTa and DSTb may control electrical connection between the plurality of memory cells MC1 to MCn and the bit line BL. In an embodiment, the cell string CS may include one drain select transistor DSTa disposed between the bit line BL and the plurality of memory cells MC1 to MCn. However, the present disclosure is not limited thereto. In an embodiment, the cell string CS may include two or more drain select transistors DSTa and DSTb which are disposed between the bit line BL and the plurality of memory cells MC1 to MCn, and are connected in series to each other. Gates of the drain select transistors DSTa and DSTb may be respectively connected to the drain select lines DSLa and DSLb.

Figure 4:
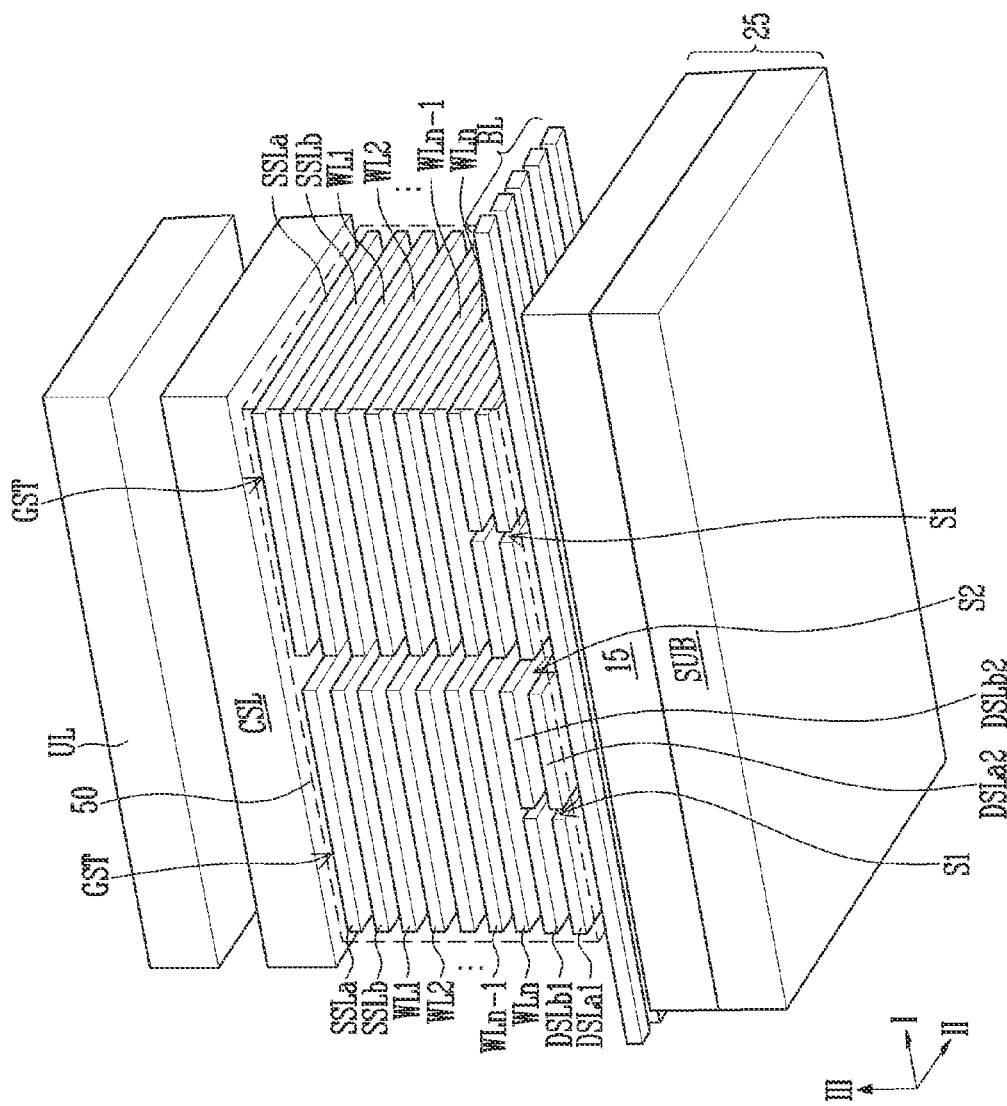
FIG. 4 is a perspective view illustrating a memory cell array in accordance with an embodiment of the present disclosure.

FIG. 4 is a perspective view illustrating a memory cell array 50 in accordance with an embodiment of the present disclosure. The memory cell array 50 shown in FIG. 4 may be applied to each of the first memory cell array 50A and the second memory cell array 50B, which are shown in FIGS. 1 and 2.

Referring to FIG. 4, the memory cell array 50 may include gate stack structures GST disposed between a plurality of bit lines BL and a common source line CSL. The common source line CSL may extend in the first direction I and the second direction II to overlap the plurality of bit lines BL. The plurality of bit lines BL may overlap a semiconductor chip 25 including the circuit group 15 described with reference to FIG. 1 and the substrate SUB described with reference to FIG. 2. The substrate SUB may overlapped by the gate stack structures GST with the plurality of bit lines BL interposed between the substrate SUB and the gate stack structures GST. Each of the bit lines BL may extend in the first direction I.

Each of the gate stack structures GST may be connected to a plurality of cell strings constituting a memory block. Each of the gate stack structures GST may include local lines SSLa, SSLb, WL1 to WLn, DSLa1, DSLa2, DSLb1, and DSLb2 extending in the second direction II. The local lines SSLa, SSLb, WL1 to WLn, DSLa1, DSLa2, DSLb1, and DSLb2 may include one or more source select lines SSLa and SSLb, a plurality of word lines WL1 to WLn, and one or more drain select lines DSLa1, DSLa2, DSLb1, and DSLb2.

The plurality of word lines WL1 to WLn may be stacked in the third direction III to be spaced apart from each other. The source select lines SSLa and SSLb may be disposed between the common source line CSL and the plurality of word lines WL1 to WLn, and be stacked in the third direction III to be spaced apart from each other. The drain select lines DSLa1, DSLa2, DSLb1, and DSLb2 may be disposed between the plurality of bit lines BL and the plurality of word lines WL1 to WLn. The drain select lines DSLa1, DSLa2, DSLb1, and DSLb2 may be isolated into two or more groups by a first slit S1. In an embodiment, the drain select lines DSLa1, DSLa2, DSLb1, and DSLb2 may include drain select lines DSLa1 and DSLb1 of a first group and drain select lines DSLa2 and DSLb2 of a second group. The drain select lines DSLa1 and DSLb1 of the first group may be isolated from the drain select lines DSLa2 and DSLb2 of the second group by the first slit S1. The drain select lines DSLa1 and DSLb1 of the first group may be stacked in the third direction III to be spaced apart from each other. The drain select lines DSLa2 and DSLb2 of the second group may also be stacked in the third direction III to be spaced apart from each other.

The gate stack structures GST may be isolated from each other by a second slit S2. The gate stack structures GST may be overlapped by an upper line layer UL with the common source line CSL interposed between the gate stack structures and the upper line layer UL. The upper line layer UL may include a plurality of components spaced apart from each other on a plane parallel to the common source line CSL. FIG. 4 illustrates a schematic position of the upper line layer UL overlapping the common source line CSL, and the layout of the components arranged in the upper line layer UL may be various.

Figure 5:
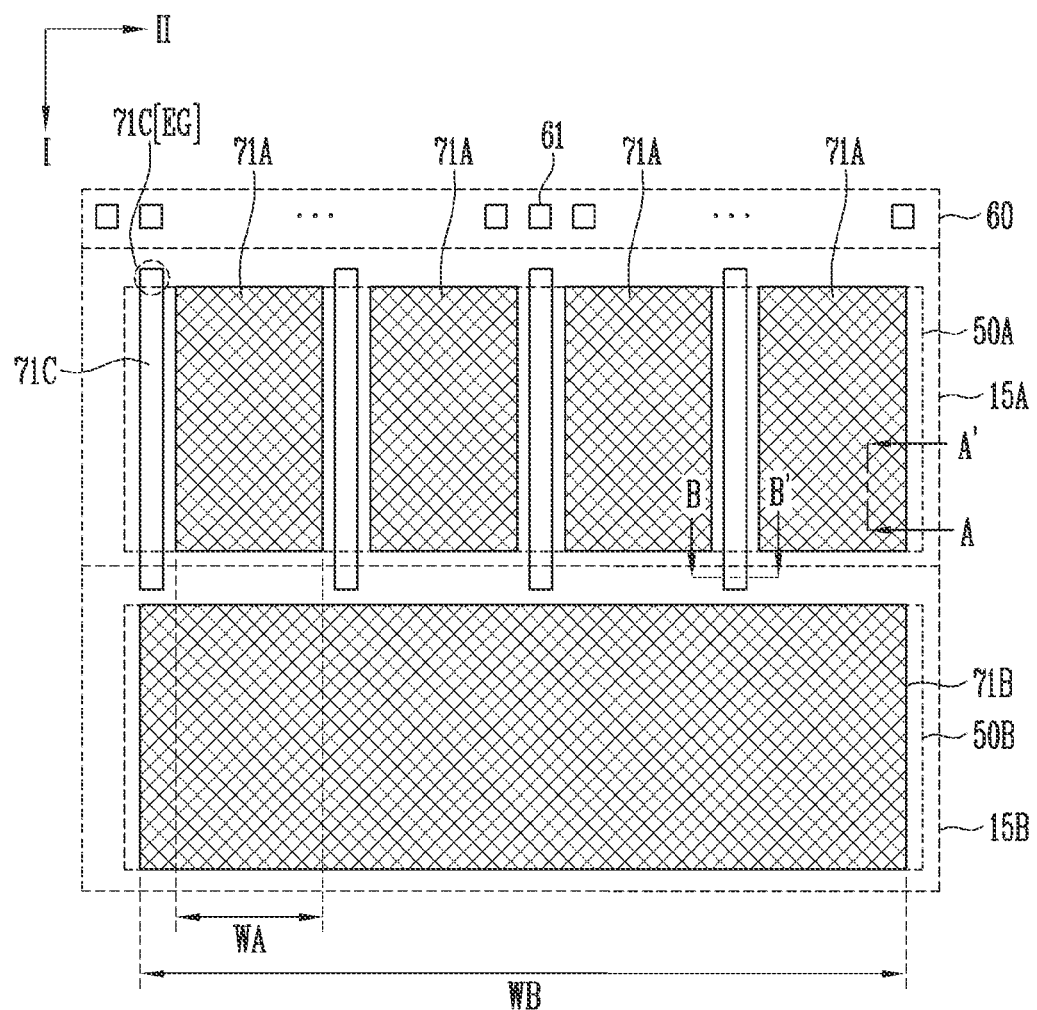
FIG. 5 illustrates a layout of an upper line layer in accordance with an embodiment of the present disclosure.

In an embodiment, the upper line layer UL may include first metal source patterns 71A, a second metal source pattern 71B, and transmission lines 71C, which are shown in FIG. 5. Although not shown in the drawing, in another embodiment, the first metal source patterns and the second metal source pattern may be omitted in the upper line layer UL, and the upper line layer UL may include transmission lines overlapping the gate stack structures GST.

FIG. 5 illustrates a layout of an upper line layer in accordance with an embodiment of the present disclosure.

Referring to FIG. 5, the upper line layer may include first metal source patterns 71A, a second metal source pattern 71B, and transmission lines 71C. Each of the first metal source patterns 71A and the second metal source pattern 71B may be formed in a mesh shape.

The first metal source patterns 71A and the transmission lines 71C may overlap a first memory cell array 50A. The first memory cell array 50A may be disposed adjacent to a pad region 60 in which a plurality of input/output pads 61 are disposed as described with reference to FIG. 2. The first memory cell array 50A may overlap a first circuit 15A. The first circuit 15A may be adjacent to the input/output pads 61 in the first direction I. The first metal source patterns 71A may be commonly connected to a first common source line CSL[A] shown in FIG. 6A, which overlaps the first memory cell array 50A.

The second metal source pattern 71B may overlap a second memory cell array 50B. The second memory cell array 50B may overlap a second circuit 15B. The second circuit 15B may be spaced farther apart from the input/output pads 61 in the first direction I than the first circuit 15A. The second metal source pattern 71B may be connected to a second common source line overlapping the second memory cell array 50B. The arrangement of the second memory cell array 50B and the second common source line refers to that of the common source line CSL and the gate stack structures GST, which are shown in FIG. 4.

The first metal source patterns 71A, the transmission lines 71C, and the second metal source pattern 71B may be spaced apart from each other on a plane parallel to the substrate SUB shown in FIG. 4. The first metal source patterns 71A may be disposed to be spaced apart from each other in the second direction II. The second metal source pattern 71B may extend in the second direction II to face the first metal source patterns 71A. In an embodiment, a width WB of the second metal source pattern 71B in the second direction II may be formed wider than a width WA of each of the first metal source patterns 71A.

The first circuit 15A may include the first row decoder 30A and the first page buffer 40A of the circuit group 15 shown in FIG. 1 and may include some of the sub-circuits of the peripheral circuit 20 of the circuit group shown in FIG. 1. The second circuit 15B may include the second row decoder 30B and the second page buffer 40B of the circuit group 15 shown in FIG. 1 and may include some of the others of the sub-circuits of the peripheral circuit 20 of the circuit group shown in FIG. 1. In an embodiment, the first circuit 15A may include the control circuit, the operation voltage generating circuit, and an internal voltage generating circuit, which are disposed in the first peripheral circuit region PAC1 described with reference to FIG. 2, and the second circuit 15B may include the source discharge circuit and the input/output circuit, which are disposed in the second peripheral circuit region PCA2 described with reference to FIG. 2.

Each of the transmission lines 71C may transmit an internal power voltage or an internal ground voltage, which is output from the internal voltage generating circuit of the first circuit 15A. The internal power voltage or the internal ground voltage from the transmission lines 71C may be supplied to a sub-circuit of the first circuit 15A and another sub-circuit of the second circuit 15B via a first contact plug CT1 shown in FIG. 6B, which is disposed between the first memory cell array 50A and the second memory cell array 50B. To this end, each of the transmission lines 71C may include an end portion 71C[EG] adjacent to the input/output pads 61, and extend in the first direction I from the end portion 71C[EG].

Although not shown in the drawing, a metal source pattern (not shown) overlapping the first memory cell array 50A may be formed to have the same wide width WB as the second metal source pattern 71B. The layout of the transmission lines 71C may be designed not to overlap the first memory cell array 50A, unlike as shown in the drawing. On the other hand, the first metal source patterns 71A in accordance with the embodiment of the present disclosure are disposed to be spaced part from each other in the second direction II. Thus, some of the transmission lines 71C may not only be disposed between the first metal source patterns 71A but may also overlap the first memory cell array 50A. Accordingly, in the embodiment of the present disclosure, the degree of arrangement freedom of the transmission lines 71C is improved. Further, in the embodiment of the present disclosure, the layout of the transmission lines 71C can be simplified, and thus the level of difficulty of a forming process of the upper line layer can be lowered.

Figure 6A:
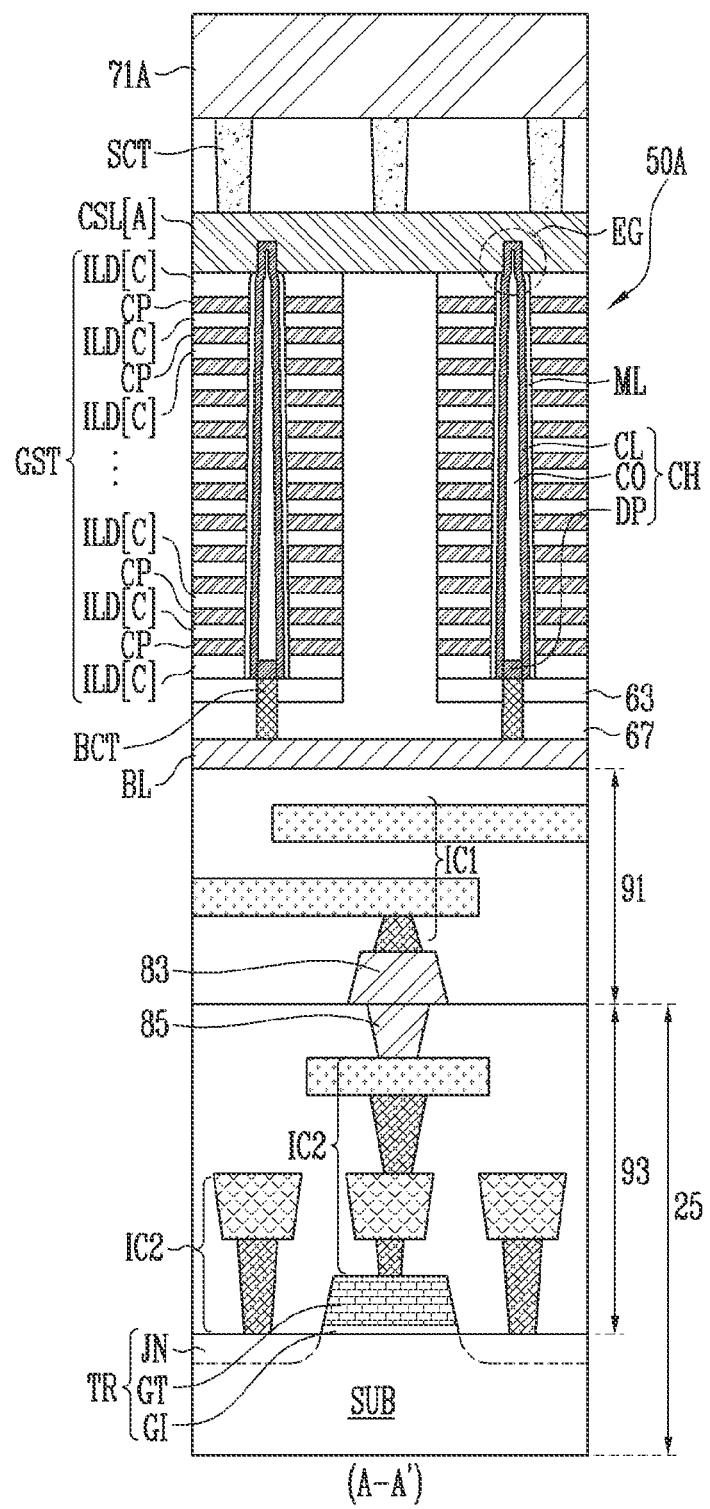
FIG. 6A is a sectional view of the semiconductor memory device taken along line A-A' shown in FIG. 5.
Figure 6B:
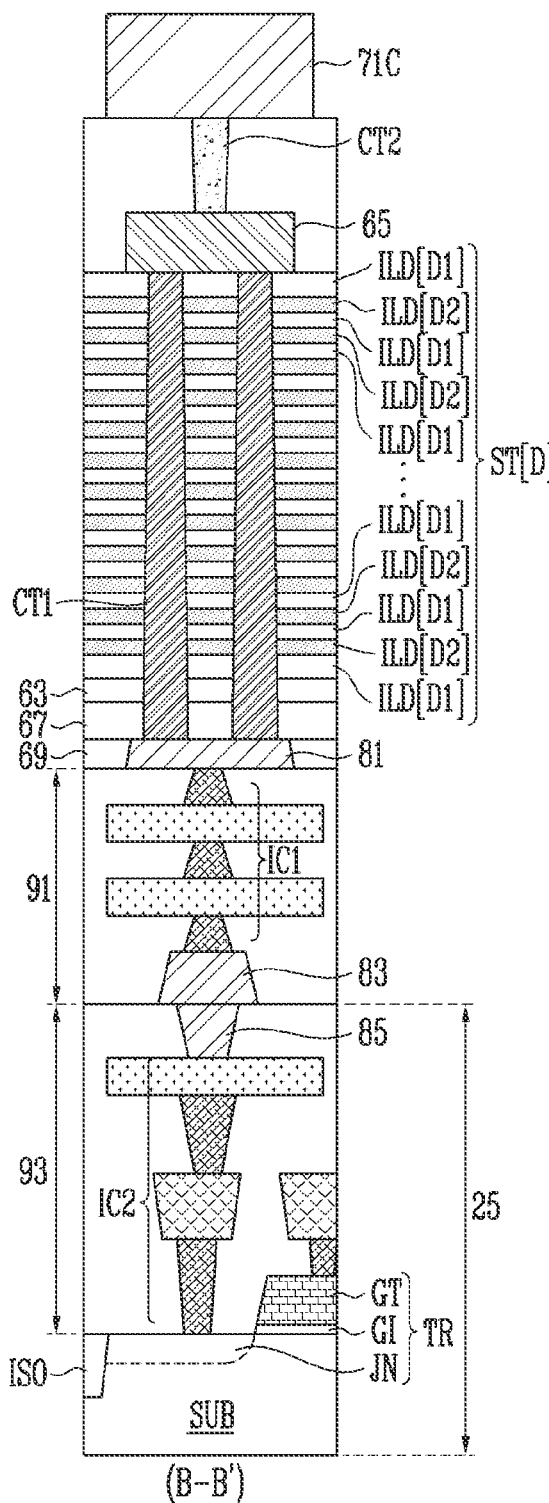
FIG. 6B is a sectional view of the semiconductor memory device taken along line B-B' shown in FIG. 5.

FIG. 6A is a sectional view of the semiconductor memory device taken along line A-A' shown in FIG. 5, and FIG. 6B is a sectional view of the semiconductor memory device taken along line B-B' shown in FIG. 5.

Referring to FIGS. 6A and 66, the first memory cell array 50A may include gate stack structures GST, a channel structure CH, and a memory pattern ML. The channel structure CH may penetrate each of the gate stack structures GST. The memory pattern ML may be disposed between each of the gate stack structures GST and the channel structure CH. The second memory cell array 50B shown in FIG. 5 may be formed in a structure similar to that of the first memory cell array 50A.

Each of the gate stack structures GST may include cell interlayer insulating layers ILD[C] and conductive patterns CP, which are alternately stacked between a bit line BL and a first common source line CSL[A]. The conductive patterns CP may be used as the local lines SSL1, SSL2, WL1 to WLn, DSLa1 and DSLb1 shown in FIG. 4.

The channel structure CH may be in direct contact with the first common source line CSL[A]. In an embodiment, the channel structure CH may include an end portion EG. The end portion EG of the channel structure CH may protrude farther toward the first common source line CSL[A] than the memory pattern ML and may extend to the inside of the first common source line CSL[A]. The channel structure CH may include a core insulating layer CO, a channel layer CL, and a doped semiconductor pattern DP.

The core insulating layer CO may extend to penetrate the cell interlayer insulating layers ILD[C] and the conductive patterns CP. The core insulating layer CO may overlap the doped semiconductor pattern DP.

The channel layer CL may surround a sidewall of the core insulating layer CO. The channel layer CL may extend between the core insulating layer CO and the first common source line CSL[A] to close an end of the core insulating layer CO, which faces the first common source line CSL[A]. The channel layer CL may extend to surround a side all of the doped semiconductor pattern DP.

The channel layer CL may include a semiconductor layer. In an embodiment, the channel layer CL may include silicon. A portion of the channel layer CL, which constitute the end portion EG of the channel structure CH, and a portion of the channel layer CL, which surrounds the doped semiconductor pattern DP, may be defined as doped regions including an impurity. In an embodiment, the doped regions may include an n-type impurity.

The doped semiconductor pattern DP may include the same impurity as the doped region of the channel layer CL. In an embodiment, the doped semiconductor pattern DP may include n-type doped silicon.

The bit line BL may be disposed between the first memory cell array 50A and a semiconductor chip 25. The bit line BL may be connected to the channel structure CH of the first memory cell array 50A via a bit line contact plug BCT penetrating insulating layers 63 and 67 disposed between the gate stack structures GST and the bit line BL.

A pad 81 of a bit line level may be disposed at a level substantially equal to that of the bit line BL. The pad 81 of the bit line level may be formed of the same conductive material as the bit line BL. The pad 81 of the bit line level may be disposed between the semiconductor chip 25 and the transmission line 71C. The pad 81 of the bit line level may be spaced apart from the bit line BL by an insulating layer 69.

The semiconductor chip 25 may be connected to first interconnection structures IC1, which are disposed between the semiconductor chip 25 and the bit line BL. Some of the first interconnection structures IC1, which are disposed between the pad 81 of the bit line level and the substrate SUB, may be connected to the pad 81 of the bit line level.

The first interconnection structures IC1 may be electrically connected to the semiconductor chip 25 through first bonding metals 83. The first bonding metals 83 and the first interconnection structures Ic1 may be buried in a first insulating structure 91.

The semiconductor chip 25 may include a substrate SUB including the circuit group 15 shown in FIG. 1, second interconnection structures IC2 connected to the circuit group 15, and second bonding metals connected to the second interconnection structures IC2. The circuit group 15, the second interconnection structures IC2, and the bonding metals 85 may be buried in a second insulating structure 93 covering the substrate SUB.

A sub-circuit of the first circuit 15A shown in FIG. 5 may be disposed in a partial region of the semiconductor chip 25, which is shown in FIG. 6A and is overlapped by the first memory cell array 50A. A sub-circuit of the second circuit 15B shown in FIG. 5 or another sub-circuit of the first circuit 15A shown in FIG. 5 may be disposed in a partial region of the semiconductor chip 25 shown in FIG. 6B. Although FIGS. 6A and 6B illustrate transistors TR included in the circuit group 15 shown in FIG. 1, the circuit group 15 may include various circuit elements, such as a resistor and a capacitor, in addition to the transistors TR.

Each of the transistors TR may include a gate insulating layer GI, a gate electrode GT, and junction regions JN. The gate insulating layer GI and the gate electrode GT may be stacked on an active region of the substrate SUB. The active region of the substrate SUB may be divided by an isolation layer ISO. The junction regions JN may be defined by injecting an impurity into the active region at both sides of the gate electrode GT. The junction regions JN may include a p-type impurity or an n-type impurity.

The second interconnection structure IC2 may be disposed between the substrate SUB and the first interconnection structures IC1. The second interconnection structures IC2 may be connected to the first interconnection structures IC1 through the first bonding metals 83 and the second bonding metals 85.

The first common source line CSL[A] may overlap the bit line BL with the first memory cell array 50A interposed between the first common source line CSL[A] and the bit line BL. The first common source line CSL[A] may be disposed between the first memory cell array 50A and the upper line layer in which the first metal source patterns 71A shown in FIG. 5 are disposed, and may extend in the first direction I and the second direction II shown in FIG. 5. The plurality of first metal source patterns 71A shown in FIG. 5 may be commonly connected to the first common source line CSL[A] through source contact plugs SCT. The source contact plugs SCT may extend toward the first metal source patterns 71A from the first common source line CSL[A].

Similarly to the arrangement of the first memory cell array 50A, the first common source line CSL[A], and the first metal source pattern 71A, a second common source line may be disposed between the second memory cell array 50B and the second metal source pattern 71B, which are shown in FIG. 5. Similarly to the connection structure between the first common source line CSL[A] and the first metal source pattern 71A, the second common source line and the second metal source pattern 71B shown in FIG. 5 may be connected by a separate source contact plug electrically insulated from the source contact plug SCT shown in FIG. 6A, The first common source line CSL[A] may be disposed at a level substantially equal to that of the second common source line, and be formed of the same conductive material as the second common source line.

The first common source line CSL[A] may include a conductive material having a resistivity lower than that of silicon. In an embodiment, the first common source line CSL[A] may include a silicide layer. Also, the first common source line CSL[A] may include a conductive material which may form an ohmic contact with the channel layer CL. In an embodiment, the first common source line CSL[A] may include tungsten silicide or nickel silicide, which is in direct contact with the channel layer CL of the channel structure CH. The conductive material of the first common source line CSL[A], which provides the ohmic contact, is in direct contact with the channel layer CL, so that the connection structure between the channel layer CL and the first common source line CSL[A] can be simplified. The tungsten silicide or the nickel silicide may be formed at a temperature lower than a temperature that causes an electromigration (EM) phenomenon of the first bonding metal 83 and the second bonding metal 85. Thus, in the present disclosure, the structural stability and operational reliability of the semiconductor memory device can be improved. In an embodiment, the first bonding metal 83 and the second bonding metal 85 may include copper.

A pad 65 of a common source line level may be disposed at a in level substantially equal to that of the first common source line CSL[A]. The pad 65 of the common source line level may be disposed between the transmission line 71C and the pad 81 of the bit line level. The pad 65 of the common source line level may be formed of the same conductive material as the first common source line CSL[A].

The pad 65 of the common source line level may be connected to the pad 81 of the bit line level through a first contact plug CT1, and be connected to the transmission line 71C through a second contact plug CT2.

The first contact plug CT1 may extend toward the pad of the common source line level from the pad 81 of the bit line level. The first contact plug CT1 may be surrounded by a dummy stack structure ST[D] and the insulating layers 63 and 67. In other words, the first contact plug CT1 may penetrate the dummy stack structure ST[D] and the insulating layers 63 and 67. The dummy stack structure ST[D] may be disposed at a level substantially equal to that of the gate stack structures GST. The dummy stack structure ST[D] may include first dummy interlayer insulating layers ILD [D1] and second dummy interlayer insulating layers ILD [D2]. The first dummy interlayer insulating layers ILD[D1] and the second dummy interlayer insulating layers ILD[D2] may be alternately stacked between the pad 81 of the bit line level and the pad 65 of the common source line level. The second dummy interlayer insulating layers ILD[D2] may include an insulating material different from that of the first dummy interlayer insulating layers ILD[D1], and the in first dummy interlayer insulating layers ILD[D1] may include the same insulating material as the cell interlayer insulating layers ILD[C]. The insulating layers 63 and 67 may extend between the dummy stack structure ST[D] and the pad 81 of the bit line level.

The second contact plug CT2 may be disposed at a level substantially equal to that of the source contact plugs SCT. The second contact plug CT2 may extend toward the transmission line 71C from the pad 65 of the common source line level.

The first metal source pattern 71A may include a material having a resistivity lower than that of the conductive material of the first common source line CSL[A], to compensate for a voltage drop due to resistance of the first common source line CSL[A]. The first metal source pattern 71A, the transmission line 71C, and the second metal source pattern 71B shown in FIG. 5 may include the same conductive material. In an embodiment, the first metal source pattern 71A, the transmission line 71C, and the second metal source pattern 71B shown in FIG. 5 may include aluminum. Each of the first metal source pattern 71A, the transmission line 71C, and the second metal source pattern 71B shown in FIG. 5 may further include a barrier metal. In an embodiment, the barrier metals may be respectively disposed along an interface between the first metal source pattern 71A and the source contact plugs SCT and an interface between the transmission line 71C and the second contact plug CT2.

Figure 7:
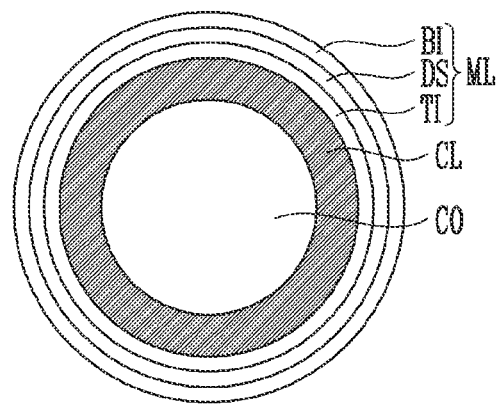
FIG. 7 illustrates an enlarged cross-section of a channel layer and a memory pattern in accordance with an embodiment of the present disclosure.

FIG. 7 illustrates an enlarged cross-section of a channel layer CL and a memory pattern ML in accordance with an embodiment of the present disclosure.

Referring to FIG. 7, the channel layer CL may surround a sidewall of a core insulating layer CO. The cross-section of the core insulating layer CO may have various shapes, such as a circular shape, an elliptical shape, or a polygonal shape.

The memory pattern ML may include a tunnel insulating layer TI, a data storage layer DS, and a blocking insulating layer BI.

The tunnel insulating layer TI may extend along a surface of the channel layer CL. The tunnel insulating layer TI may include an insulating material through which charges can tunnel. In an embodiment, the tunnel insulating layer TI may include a silicon oxide layer.

The data storage layer DS may extend along a surface of the tunnel insulating layer TI. The data storage layer DS may include a material layer capable of storing data. In an embodiment, the data storage layer DS may include a nitride layer capable of storing data changed by using Fowler-Nordheim (F-N) tunneling.

The blocking insulating layer BI may extend along a surface of the data storage layer. The blocking insulating layer BI may include an oxide layer.

Figure 8A:
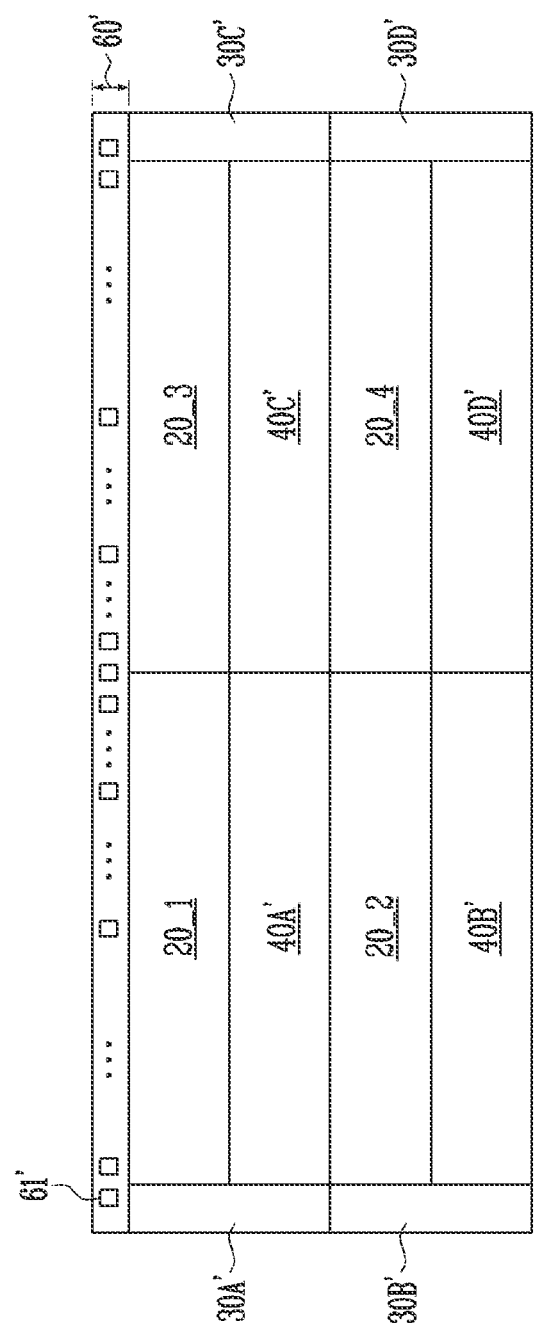
FIGS. 8A and 8B illustrate arrangements of a circuit group in accordance with embodiments of the present disclosure.
Figure 8B:
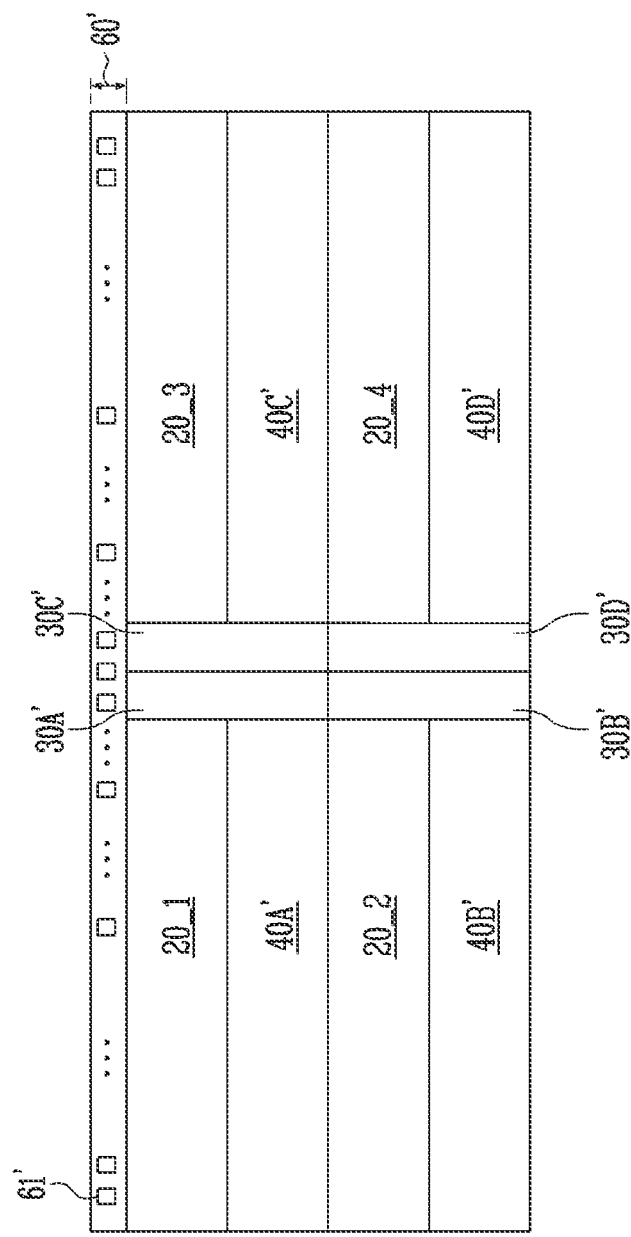

FIGS. 8A and 8B illustrate arrangements of a circuit group in accordance with embodiments of the present disclosure.

Referring to FIGS. 8A and 8B, the circuit group may be configured to individually control four planes at the same time. To this end, the circuit group may include a first row decoder 30A' and a first page buffer 40A', which are connected to a first memory cell array, a second row decoder 30B' and a second page buffer 40B', which are connected to a second memory cell array, a third row decoder 30C' and a third page buffer 40C', which are connected to a third memory cell array, a fourth row decoder 30D' and a fourth page buffer 40D', which are connected to a fourth memory cell array, and first to fourth peripheral circuit groups 20_1, 20_2, 20_3, and 20_4. Although not shown in the drawings, the first to fourth memory cell arrays may be disposed to overlap the circuit group.

Various operations of the first to fourth memory cell arrays may be controlled by the first, second, third, and fourth row decoders 30A', 30B', 30C', and 30D'; the first second, third, and fourth page buffers 40A', 40B', 40C, and 40D'; and a peripheral circuit. The peripheral circuit may include sub-circuits distributed and disposed in the first to fourth peripheral circuit groups 20_1, 20_2, 20_3, and 20_4.

The first peripheral circuit group 20_1 and the third peripheral circuit group 20_3 may be disposed adjacent to a pad region 60' including a plurality of input/output pads 61'. The second peripheral circuit group 20_2 and the fourth peripheral circuit group 20_4 may be disposed to be spaced farther apart from the pad region 60' than the first peripheral circuit group 20_1 and the third peripheral circuit group 20_3. The first peripheral circuit group 20_1 may be disposed between the pad region 60' and the second peripheral circuit group 20_2, and the third peripheral circuit group 20_3 may be disposed between the pad region 60' and the fourth peripheral circuit group 20_4.

The first peripheral circuit group 20_1 and the third peripheral circuit group 20_3 may include sub-circuits which require high-speed operation and requires minimization of voltage drop. In an embodiment, a control circuit, an operation voltage generating circuit, and an internal voltage generating circuit may be distributed and disposed in the first peripheral circuit group 20_1 and the third peripheral circuit group 20_3.

The second peripheral circuit group 20_2 and the fourth peripheral circuit group 20_4 may include the other sub-circuits which are not disposed in the first peripheral circuit group 20_1 and the third peripheral circuit group 20_3. In an embodiment, a source discharge circuit and an input/output circuit may be distributed and disposed in the second peripheral circuit group 20_2 and the fourth peripheral circuit group 20_4.

The first page buffer 40A' may be disposed between the first peripheral circuit group 20_1 and the second peripheral circuit group 20_2, and the second peripheral circuit group 20_2 may be disposed between the first page buffer 40A' and the second page buffer 40B'. The third page buffer 40C' may be disposed between the third peripheral circuit group 20_3 and the fourth peripheral circuit group 20_4, and the fourth peripheral circuit group 20_4 may be disposed between the third page buffer 40C' and the fourth page buffer 40D'.

The first row decoder 30A' and the third row decoder 30C' may be disposed adjacent to the pad region 60'. The second row decoder 30B' and the fourth row decoder 30D' may be disposed to be spaced farther apart from the pad region 60' than the first row decoder 30A' and the third row decoder 30C'. The first row decoder 30A' may be disposed between the pad region 60' and the second row decoder 30B', and the third row decoder 30C' may be disposed between the pad region 60' and the fourth row decoder 30D'.

Referring to FIG. 8A, in an embodiment, the first peripheral circuit group 20_1, the third peripheral circuit group 20_3, the first page buffer 40A', and the third page buffer 40C' may be disposed between the first row decoder 30A' and the third row decoder 30C'. In addition, the second peripheral circuit group 20_2, the fourth peripheral circuit group 20_4 the second page buffer 40B', and the fourth page buffer 40D' may be disposed between the second row decoder 30B' and the fourth row decoder 30D'.

Referring to FIG. 8B, in an embodiment, the first row decoder 30A' and the third row decoder 30C may be disposed between the first peripheral circuit group 20_1 and the third peripheral circuit group 20_3. In addition, the second row decoder 30B' and the fourth row decoder 30D' may be disposed between the second peripheral circuit group 20_2 and the fourth peripheral circuit group 20_4.

Referring to FIGS. 8A and 8B, the first metal source patterns 71A and the transmission lines 71C, which are described with reference to FIG. 5, may overlap a first circuit including the first peripheral circuit in group 20_1 and the first page buffer 40A'. The second metal source pattern 71B described with reference to FIG. 5 may overlap a second circuit including the second peripheral circuit group 20_2 and the second page buffer 408'. Third metal source patterns and separate transmission lines, which have a structure similar to that of the first metal source patterns 71A and the transmission lines 71C, which are described with reference to FIG. 5, may overlap a third circuit including the third peripheral circuit group 20_3 and the third page buffer 40C'. A fourth metal source pattern having a structure similar to that of the second metal source pattern 71B described with reference to FIG. 5 may overlap a fourth circuit including the fourth peripheral circuit group 20_4 and the fourth page buffer 40D'.

Figure 9:
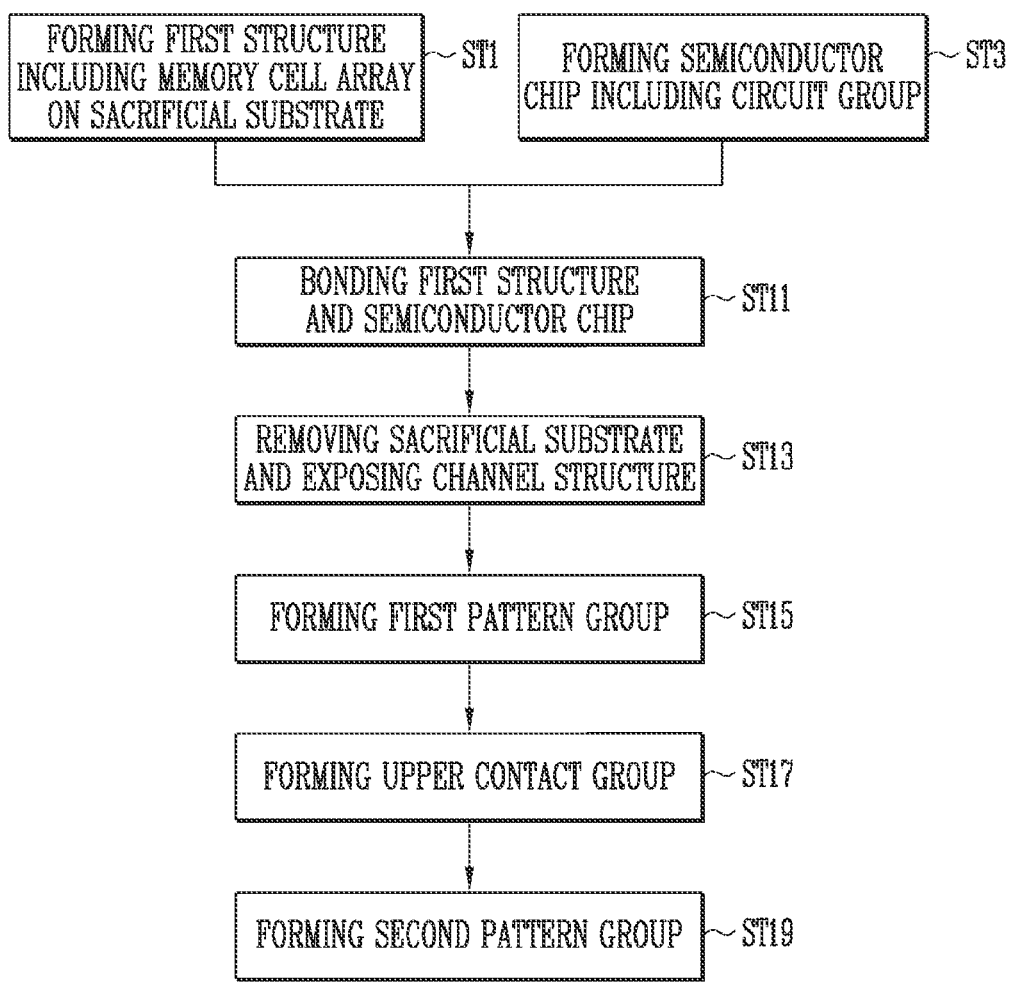
FIG. 9 is a flowchart schematically illustrating a manufacturing method of a semiconductor memory device in accordance with an embodiment of the present disclosure.

FIG. 9 is a flowchart schematically illustrating a manufacturing method of a semiconductor memory device in accordance with an embodiment of the present disclosure.

Referring to FIG. 9, the manufacturing method of the semiconductor memory device may include step ST1 of forming a first structure including a memory cell array on a sacrificial substrate, step ST3 of forming a semiconductor chip including a circuit group, step ST11 of bonding the first structure and the semiconductor chip, step ST13 of removing the sacrificial substrate and exposing a channel structure, step ST15 of forming a first pattern group, step ST17 of forming an upper contact group, and step ST19 of forming a second pattern group.

Processes performed after the step ST11 may be performed at a temperature lower than a temperature that causes an electromigration (EM) phenomenon of bonding metals. In an embodiment, the processes performed after the step ST11 may be performed at a temperature of 450° C. or lower.

Hereinafter, the manufacturing method of the semiconductor memory device in accordance with the embodiment of the present disclosure will be described with reference to FIGS. 10A to 10D, 11A and 11B, 12A and 12B, and 13, which illustrate a manufacturing method of the semiconductor memory device shown in FIG. 5 for each process step.

Figure 10A:
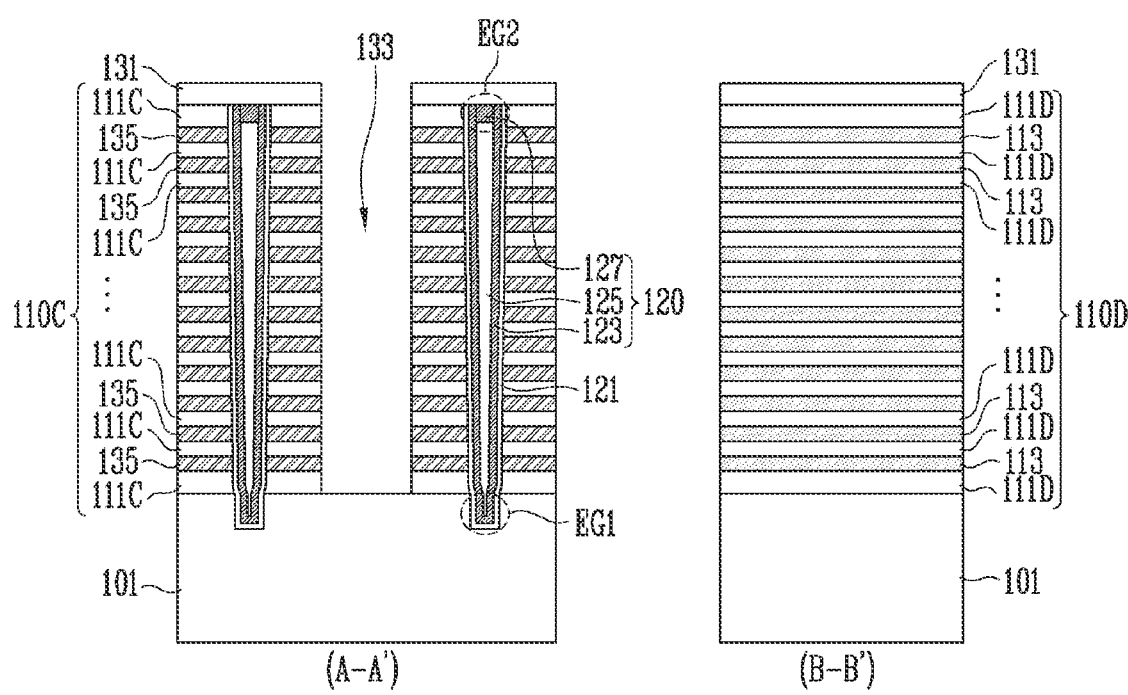
FIGS. 10A to 10D are sectional views illustrating an embodiment of step ST1 shown in FIG. 9.

FIGS. 10A to 103 are sectional views illustrating an embodiment of the step ST1 shown in FIG. 9.

Referring to FIG. 10A, a memory cell array 110C and a dummy stack structure 110D may be formed on a sacrificial substrate 101.

The memory cell array 1100 may include cell interlayer insulating layers 1110 and conductive patterns 135, which are alternately stacked on the sacrificial substrate 101, a channel structure 120 penetrating the cell interlayer insulating layers 111C and the conductive patterns 135, and a memory layer 121 extending along a surface of the channel structure 120.

The channel structure 120 may include a channel layer 123, a core insulating layer 125, and a doped semiconductor pattern 127 as described with reference to FIG. 6A. The channel structure 120 may include a first end portion EG1 extending into the sacrificial substrate 101. The channel structure 120 may include a second end portion EG2 which faces in a direction opposite to that of the first end portion EG1. The second end portion EG2 may include the doped semiconductor pattern 127 and a portion of the channel layer 123, which surrounds the doped semiconductor pattern 127. The portion of the channel layer 123, which is surrounded by the doped semiconductor pattern 127, may include an impurity diffused from the doped semiconductor pattern 127. In an embodiment, the doped semiconductor pattern 127 and a portion of the channel layer 123, which is adjacent to the doped semiconductor pattern 127, may include an n-type impurity.

The memory layer 121 may include the tunnel insulating layer TI, the data storage layer DS, and the blocking insulating layer BI, which are shown in FIG. 7. The memory layer 121 may surround a side all of the channel structure 120, and extend between the channel structure 120 and the sacrificial substrate 101.

The dummy stack structure 110D may include first dummy interlayer insulating layers 111D and sacrificial insulating layers 113, which are alternately stacked on the sacrificial substrate 101. The first dummy interlayer insulating layers 111D may be respectively disposed at levels substantially equal to those of the cell interlayer insulating layers 111C. The first dummy interlayer insulating layers 111D may include the same insulating material as the cell interlayer insulating layers 111C. The sacrificial insulating layers 113 may include an insulating material having an etch selectivity with respect to the first dummy interlayer insulating layers 111D and the cell interlayer insulating layers 111C. In an embodiment, the first dummy interlayer insulating layers 111D and the cell interlayer insulating layers 111C may include a silicon oxide layer, and the sacrificial insulating layers 113 may include a silicon nitride layer.

In an embodiment, the process of forming the memory cell array 110C and the dummy stack structure 110D may include a process of forming a preliminary stack structure by alternately stacking interlayer insulating layers and the sacrificial insulating layers 113 on the sacrificial substrate 101, a step of channel hole which penetrates the preliminary stack structure and extends to the inside of the sacrificial substrate 101, a process of forming the memory layer 121 on a surface of the channel hole, a process of forming the channel structure 120 filling a central region of the channel hole, which is opened by the memory layer 121, a process of forming, on the preliminary stack structure, a first insulating layer 131 extending to cover the channel structure 120, a process of forming a slit 133 penetrating the first insulating layer 131 and the preliminary stack structure, and a process of replacing portions of the sacrificial insulating layers 113 surrounding the channel structure 120 with the conductive patterns 135 through the slit 133. Other portions of the sacrificial insulating layers 113, which are not replaced with the conductive patterns 135, may remain as second dummy insulating layers constituting the dummy stack structure 110D. The interlayer insulating layers may be divided into the cell interlayer insulating layers 111C overlapping with the conductive patterns 135 and the first dummy interlayer insulating layers 111D overlapping the remaining sacrificial insulating layers 113.

Figure 10B:
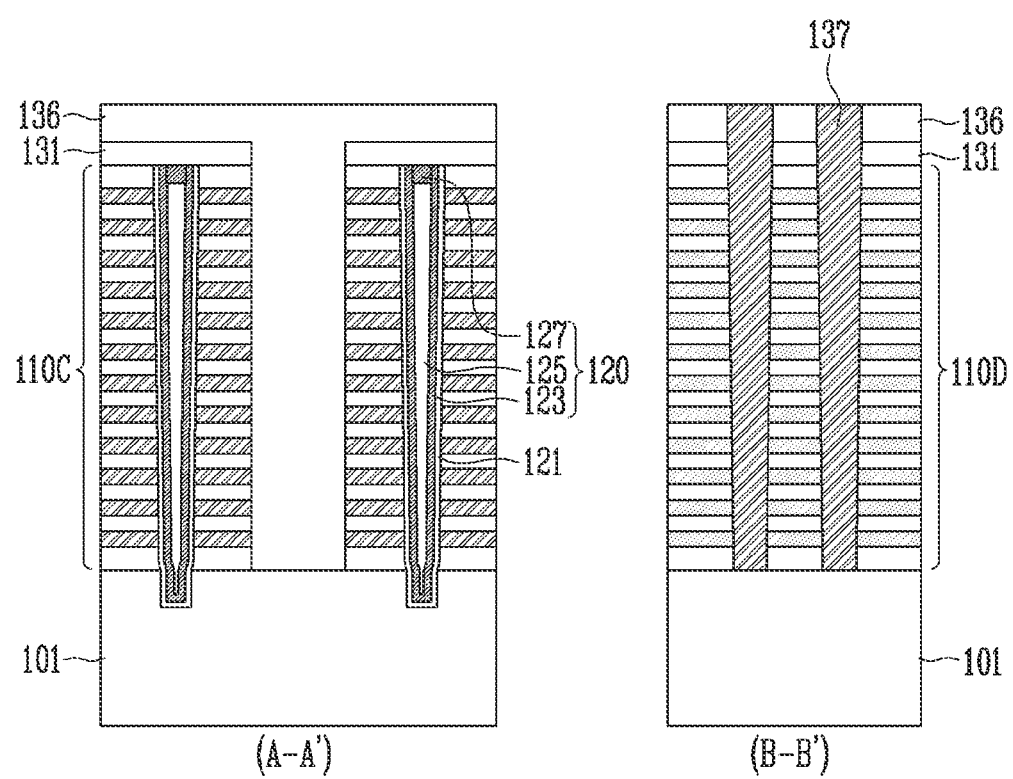

Referring to FIG. 10B, the slit 133 shown in FIG. 10A may be filled with a second insulating layer 136. The second insulating layer 136 may extend to cover the first insulating layer 131.

Subsequently, a first contact plug 137 may be formed. The first contact plug 137 may penetrate the dummy stack structure 110D, the first insulating layer 131, and the second insulating layer 136. The first contact plug 137 may be in contact with the sacrificial substrate 101. The first contact plug 137 may be formed of various conductive materials.

Figure 10C:
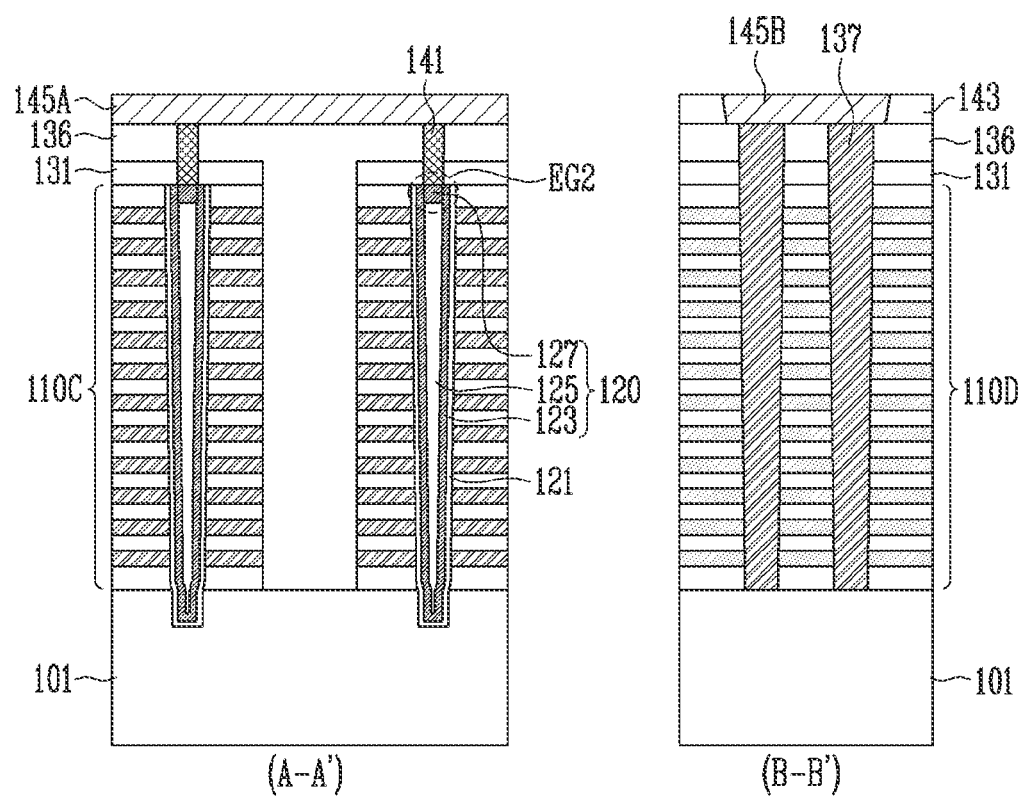

Referring to FIG. 10C, a bit line contact plug 141 may be formed. The bit line contact plug 141 may penetrate the first insulating layer 131 and the second insulating layer 136. The bit line contact plug 141 may overlap the channel structure 120 of the memory cell array 110C. The bit line contact plug 141 may be formed of various conductive materials.

Subsequently, a third insulating layer 143 may be formed on the second insulating layer 136. The third insulating layer 143 may extend to cover the bit line contact plug 141 and the first contact plug 137. Subsequently, a bit line 145A and a pad 145B of a bit line level may be formed to penetrate the third insulating layer 143. The bit line 145A and the pad 145B of the bit line level may be formed of the same conductive material, and be formed by using a single mask process.

The bit line 145A may be connected to the bit line contact plug 141, and be connected to the second end portion EG2 of the channel structure 120 via the bit line contact plug 141. The pad 145B of the bit line level may be connected to the first contact plug 137.

Figure 10D:
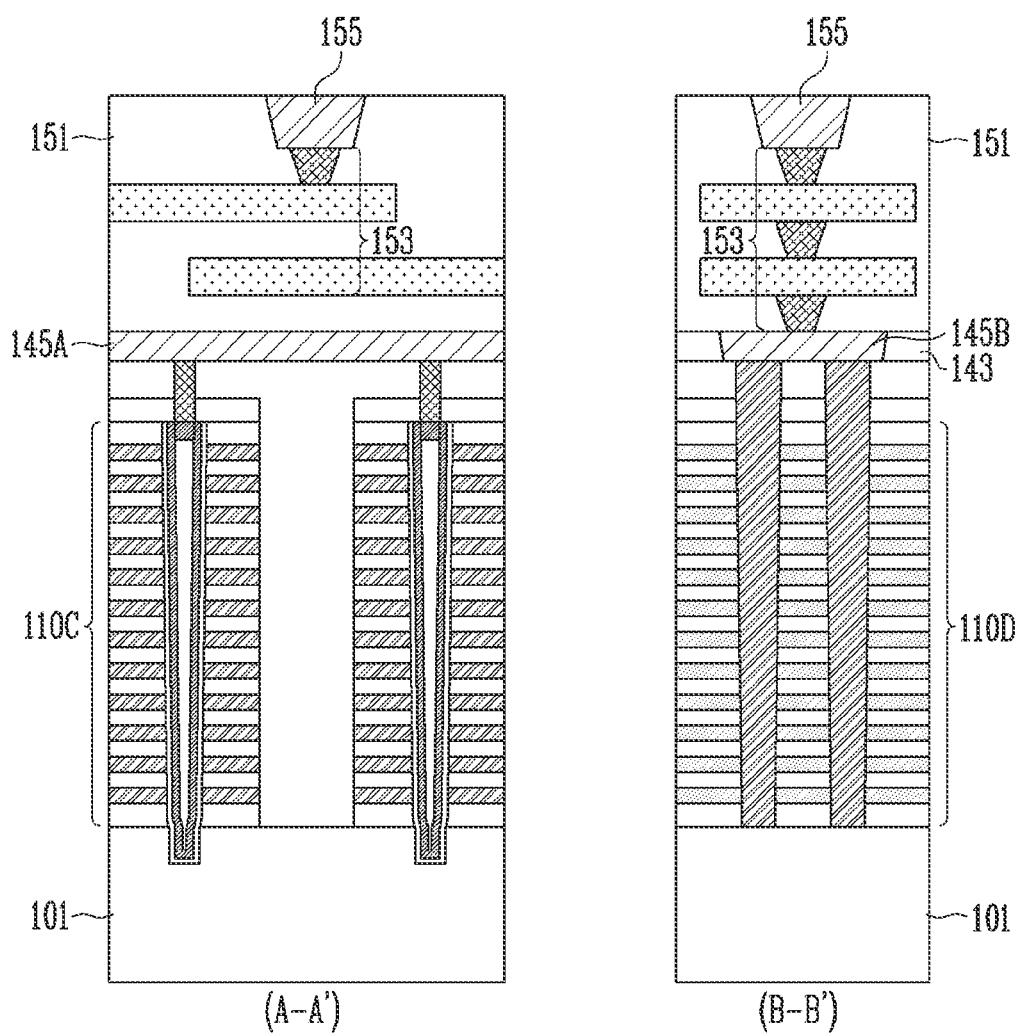

Referring to FIG. 10D, there may be formed a first insulating structure 151 covering the bit line 145A and the pad 145B of the bit line level, and first interconnection structures 153 and first bonding metals 155, which are buried in the first insulating structure 151. The first insulating structure 151 may include multi-layered insulating layers. The first interconnection structures 153 may include conductive lines and conductive pads, which extend in various directions, and conductive vias connecting the conductive lines and the conductive pads. Some of the first interconnection structures 153 may be connected to the pad 145B of the bit line level. The first bonding metals 155 may be connected to the first interconnection structures 153.

Figure 11A:
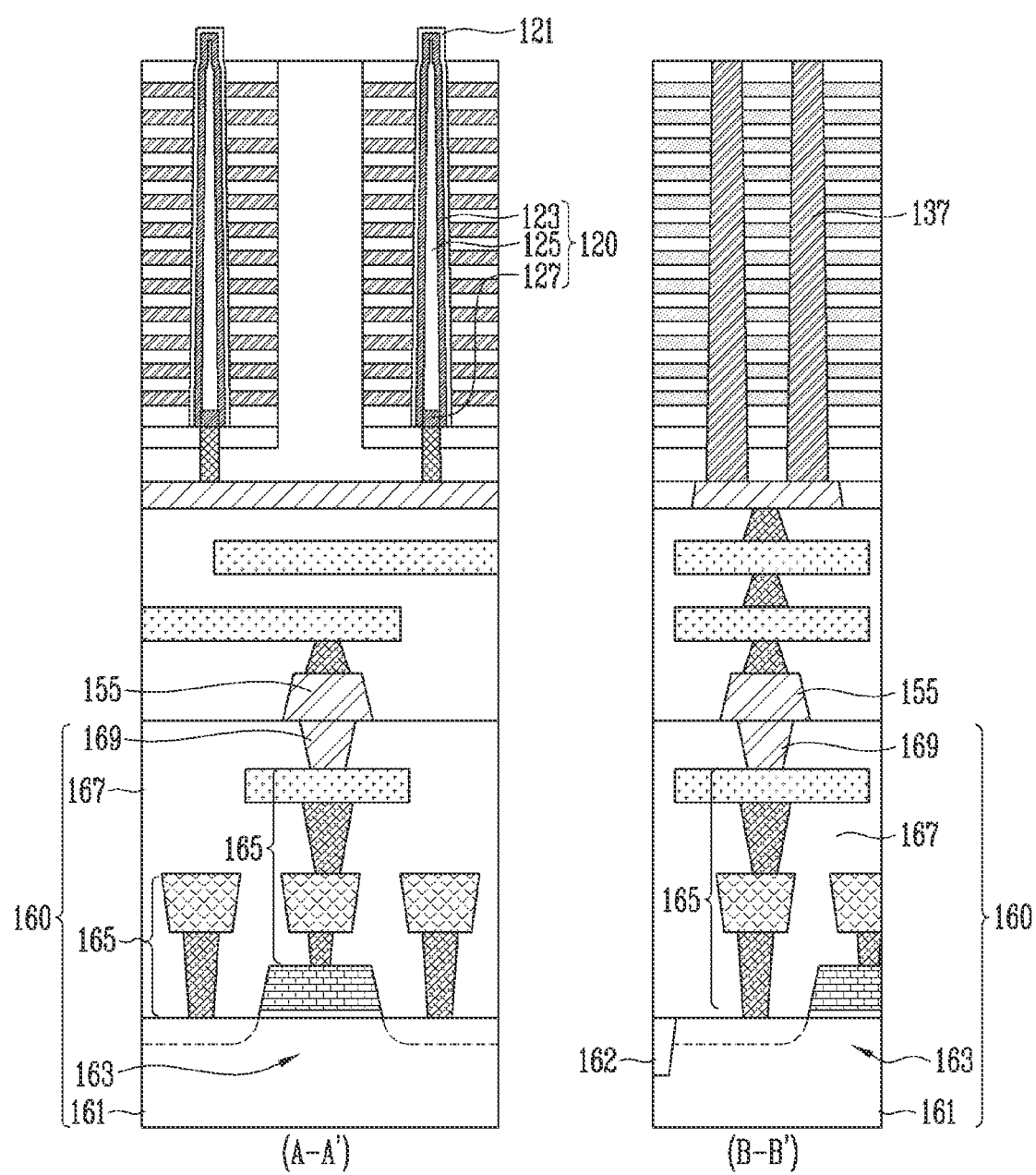
FIGS. 11A and 11B are sectional views illustrating an embodiment of steps ST11 and ST13 shown in FIG. 9.
Figure 11B:
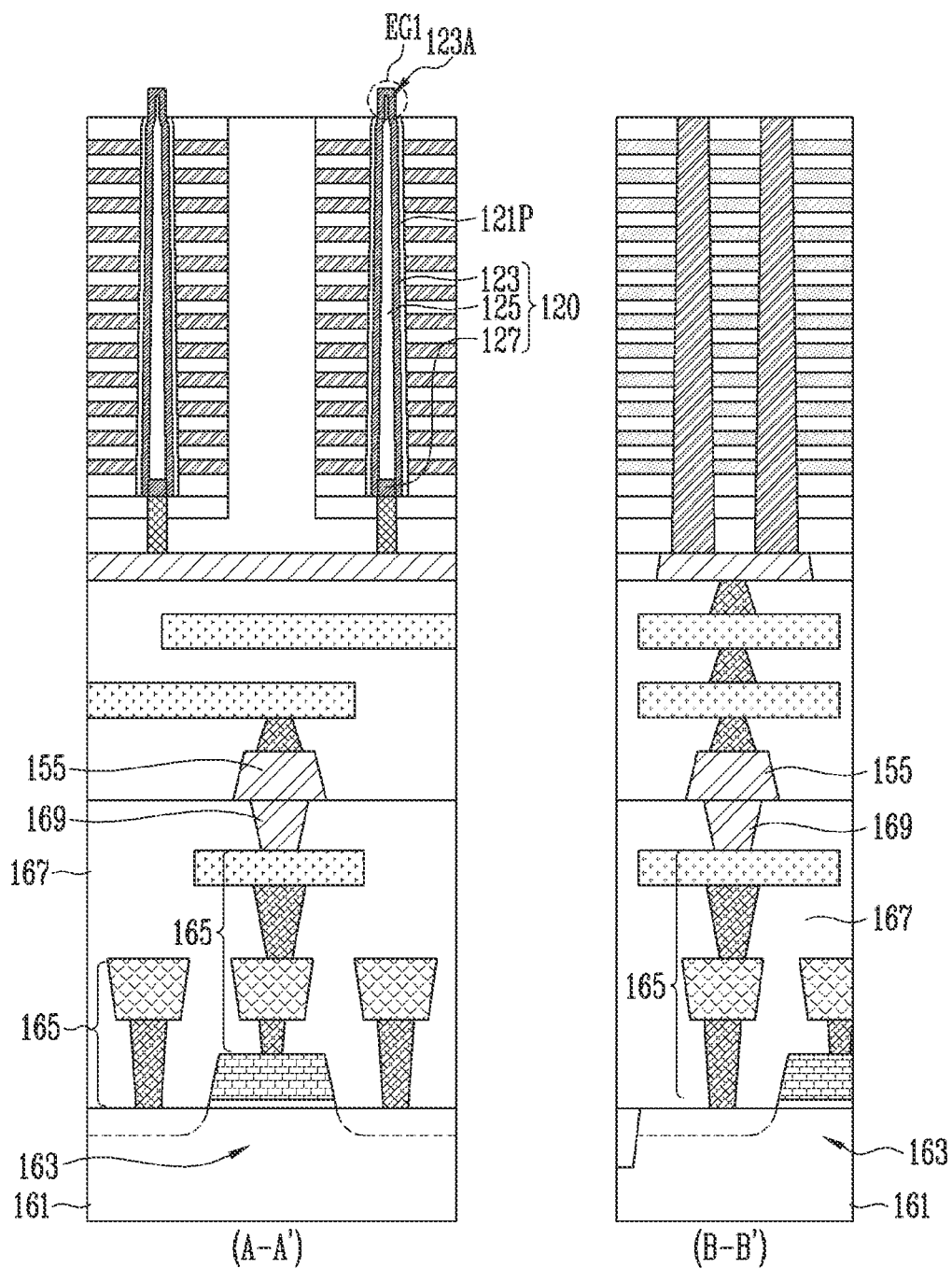

FIGS. 11A and 11B are sectional views illustrating an embodiment of the steps ST11 and ST13 shown in FIG. 9.

Referring to FIG. 11A, before the step ST11 is performed, a semiconductor chip 160 may be provided through the step ST3 shown in FIG. 9. The semiconductor chip 160 may include a substrate 161 including a circuit group, second interconnection structures 165, and second bonding metals 169.

The circuit group may include a plurality of transistors 163 insulated from each other by an isolation layer 162. The second interconnection structures 165 and the second bonding metals 169 may be buried in a second insulating structure 167 covering the substrate 161. The second insulating structure 167 may include multi-layered insulating layers. The second interconnection structures 165 may include conductive lines and conductive pads, which extend in various directions, and conductive vias connecting the conductive lines and the conductive patterns. The second interconnection structures 165 may be connected to the transistors 163. The second bonding metals 169 may be connected to the second interconnection structures 165.

The first bonding metals 155 and second bonding metals 169 may be bonded to each other through the step ST11. The first bonding metals 155 and second bonding metals 169 may include a metal with which the first bonding metals 155 and second bonding metals 169 can be coupled to each other through an inter-metal bonding process. In an embodiment, the first bonding metals 155 and second bonding metals 169 may include copper.

Subsequently, the sacrificial substrate 101 shown in FIG. 10D may be removed through the step ST13. Accordingly, the memory layer 121 and the first contact plug 137 may be exposed.

Referring to FIG. 11B, an exposed region of the memory layer 121 shown in FIG. 11A may be removed such that the first end portion EG of the channel structure 120 is exposed, hereinafter, a remaining region of the memory layer may be designated as a memory pattern 121P.

Before the exposed region of the memory layer is removed, an impurity region 123A may be formed by injecting an impurity into a portion of the channel layer 123, which is included in the first end portion EG1 of the channel structure 120. In an embodiment, the impurity region 123A may include an n-type impurity.

Figure 12A:
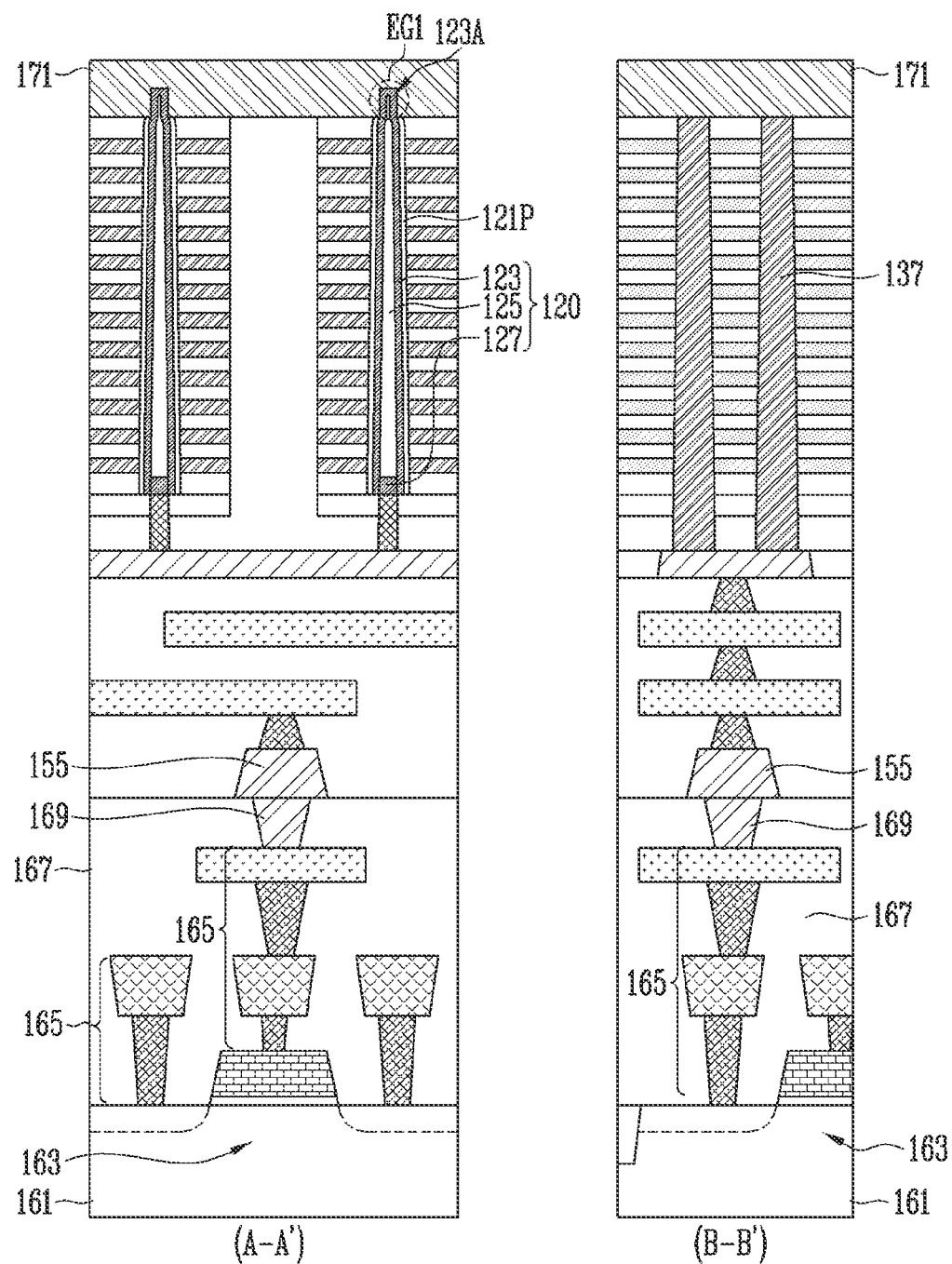
FIGS. 12A and 12B are sectional views illustrating an embodiment of step ST15 shown in FIG. 9.
Figure 12B:
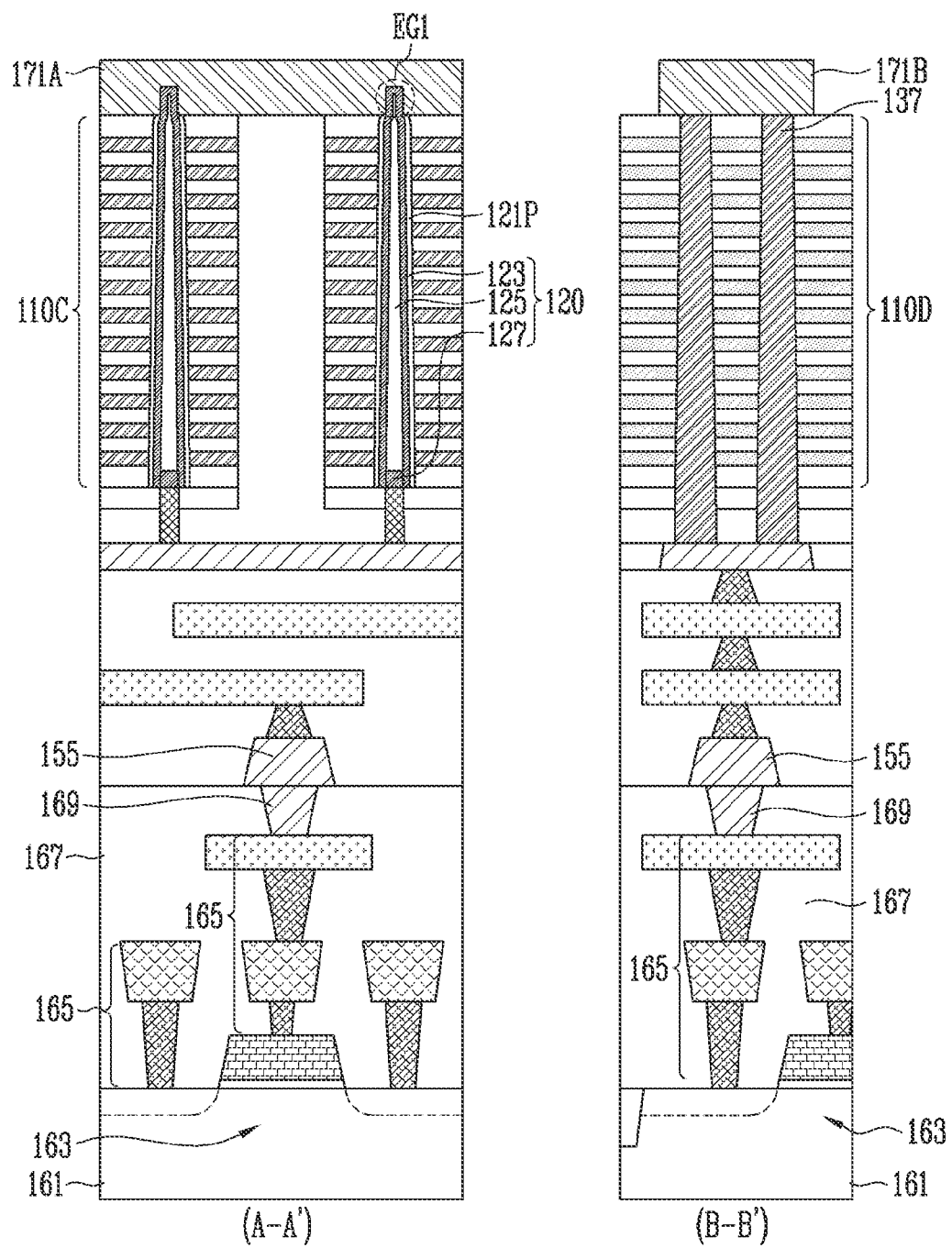

FIGS. 12A and 12B are sectional views illustrating an embodiment of the step ST15 shown in FIG. 9.

Referring to FIG. 12A, the step ST15 may be performed at a temperature lower than a temperature that causes an electromigration (EM) phenomenon of the first bonding metal 155 and the second bonding metal 169. In an embodiment, the step ST15 may be performed at a temperature of 450° C. or lower. Through the step ST15, a first conductive layer 171 may be formed. The first conductive layer 171 may include a conductive material having a resistivity lower than that of silicon. Also, the first conductive layer 171 may include a conductive material in direct contact with the first end portion EG1 of the channel structure 120 to provide an ohmic contact. In an embodiment, the first conductive layer 171 may include tungsten silicide or nickel silicide.

The first conductive layer 171 may be in direct contact with the first end portion EG1 of the channel structure 120. More specifically, the first conductive layer 171 may be in direct contact with the impurity region 123A of the channel layer 123, which is exposed at the first end portion EG1 of the channel structure 120.

The first conductive layer 171 may be connected to the first contact plug 137. In an embodiment, the first conductive layer 171 may be in contact with a barrier metal of the first contact plug 137.

Referring to FIG. 12B, a first pattern group including a common source line 171A and a pad 171B of a common source line level in may be defined by etching the first conductive layer 171 shown in FIG. 12A.

The common source line 171A may surround the first end portion EG1 of the channel structure 120 and be in direct contact with the channel layer 123. The common source line 171A may overlap the memory cell array 110G.

The pad 171B of the common source line level may be connected to the first contact plug 137, and may overlap the dummy stack structure 110D.

Figure 13:
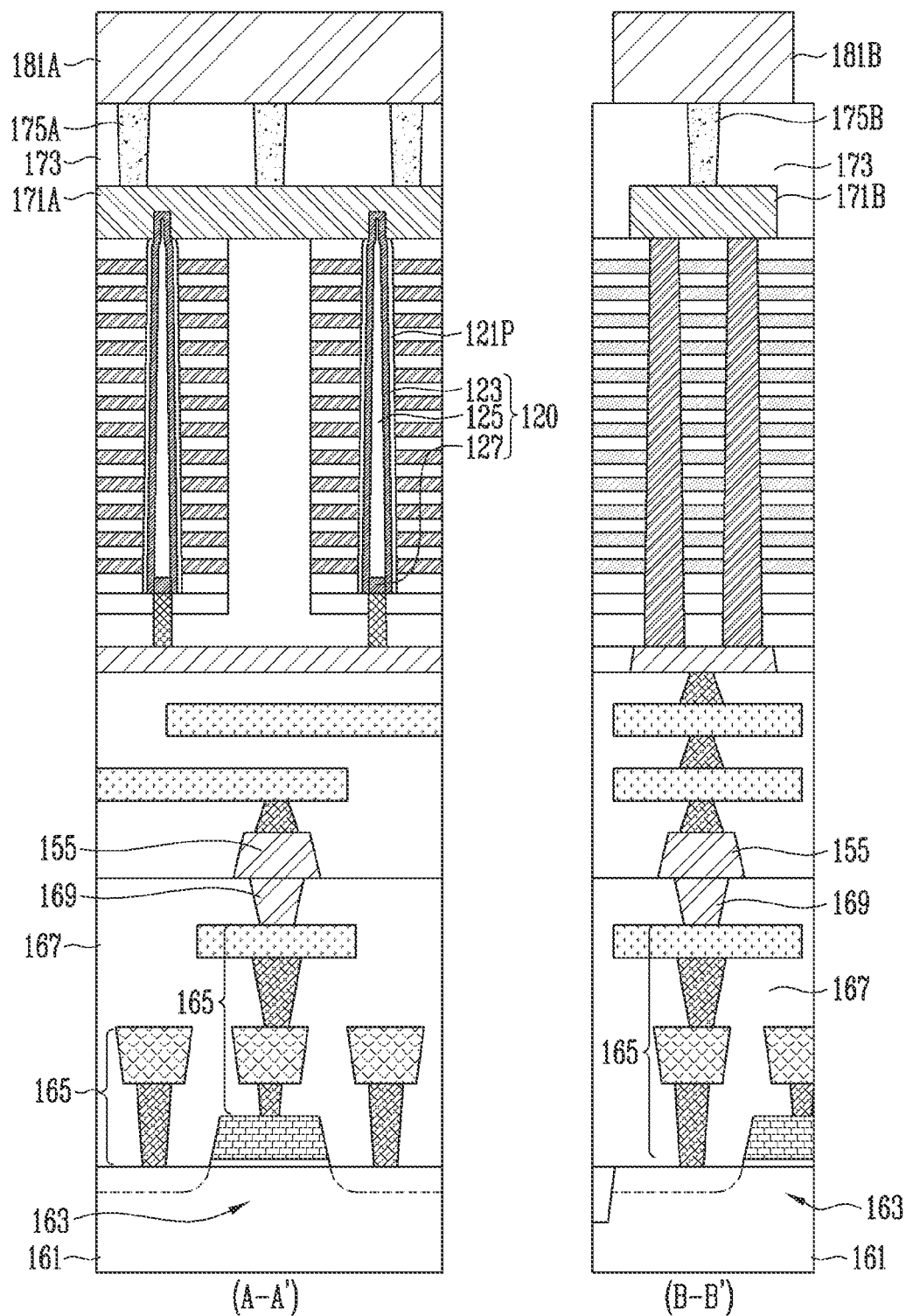
FIG. 13 is a sectional view illustrating an embodiment of steps ST17 and ST19 shown in FIG. 9.

FIG. 13 is a sectional view illustrating an embodiment of the steps ST17 and ST19 shown in FIG. 9.

Referring to FIG. 13, an upper contact group including source contact plugs 175A and a second contact plug 175B may be formed through the step ST17. The source contact plugs 175A and the second contact plug 175B may penetrate a fourth insulating layer 173. The fourth insulating layer 173 may insulate between the common source line 171A and the pad 171B of the common source line level, and extend to cover the common source line 171A and the pad 171B of the common source line level.

The source contact plugs 175A may be connected to the common source line 171A. The second contact plug 175B may be connected to the pad 171B of the common source line level.

Subsequently, a second pattern group including metal source patterns 181A and a transmission line 181B may be formed through the step ST19. The metal source patterns 181A and the transmission line 181B may include a conductive material having a resistivity lower than that of the first conductive layer 171 shown in FIG. 12A. The metal source patterns 181A and the transmission line 181B may be formed at a temperature (e.g., 450° C. or lower) lower than a temperature that causes the electromigration (EM) phenomenon of the first bonding metal 155 and the second bonding metal 169. In an embodiment, the metal source patterns 181A and the transmission line 181B may include aluminum.

The metal source patterns 181A and the transmission line 181B may be spaced apart from each other on a plane parallel to the common source line 171A. The metal source patterns 181A and the transmission line 181B may be formed to have a layout identical to that of the first metal source patterns 71A and the transmission line 71C, which are described with reference to FIG. 5.

The metal source patterns 181A may be formed in a mesh shape, and be commonly connected to the common source line 171A via the source contact plugs 175A. The transmission line 181B may be connected to the second contact plug 175B.

In accordance with the embodiments of the present disclosure, the common source line in direct contact with the channel structure is formed of a conductive material which can provide an ohmic contact, so that the connection structure between the channel structure and the common source line can be simplified, as compared with when the common source line is formed as a doped semiconductor layer. For example, when the common source line includes a doped silicon layer in direct contact with the channel structure, a silicide layer for providing an ohmic contact layer on the doped silicon layer may be added. A cell current of the channel structure may flow via the doped silicon layer of the common source line and the silicide layer provided as the ohmic contact layer. In the embodiment of the present disclosure, the conductive material providing the ohmic contact without interposition of the doped silicon layer is in direct contact with the channel structure, so that the flow path of the cell current can be simplified.

In addition, in the present disclosure, the common source line is formed of a conductive material having a low resistivity, so that the resistance of the common source line can be lowered.

In order to compensate for a voltage drop due to the common source line, metal source patterns may be connected to the common source line. In accordance with the embodiments of the present disclosure, because the resistance of the common source line is lowered, the metal source patterns connected to the common source line can be omitted or the area of the metal source patterns can be reduced.

In accordance with the embodiments of the present disclosure, because the area of the metal source patterns is reduced, the metal source patterns overlapping the memory cell array can be disposed to be spaced apart from each other. Accordingly, in the present disclosure, a space can be provided, in which transmission lines for transmitting a signal from the circuit group are disposed, between the metal source patterns. Thus, in the present disclosure, the degree of arrangement freedom of lines can be increased within a limited area.

In accordance with the embodiments of the present disclosure, the common source line in direct contact with the channel structure is formed at a temperature of 450° C. or lower to address a problem of defects that can occur in a process of forming the common source line in the boding metals bonded before the common source line is formed. Accordingly, in the present disclosure, the operational reliability of the semiconductor memory device can be improved.

Figure 14:
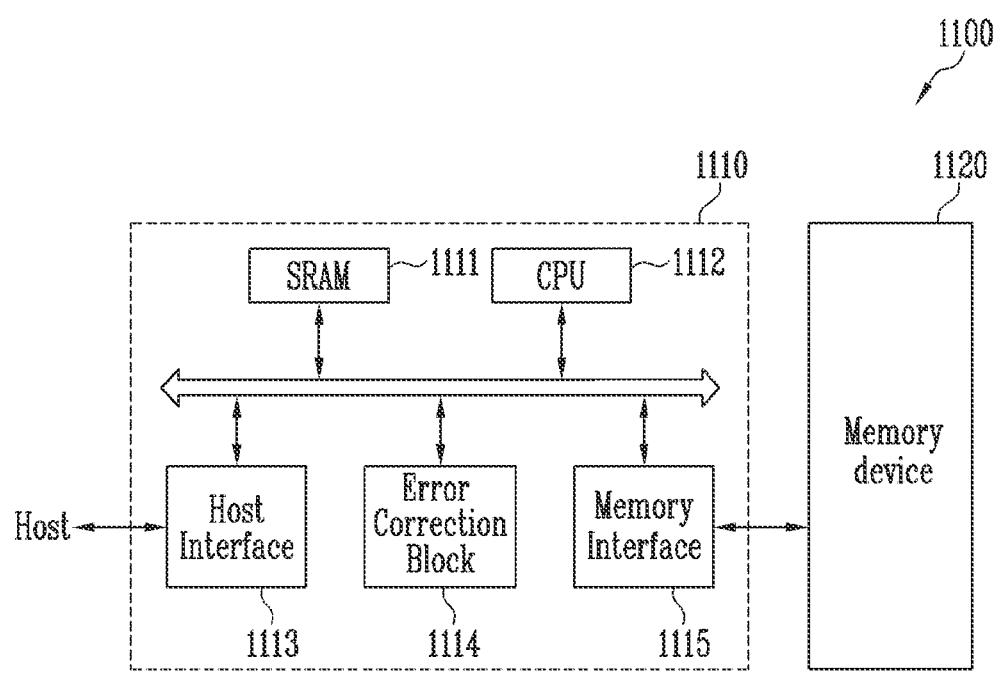
FIG. 14 is a block diagram illustrating a configuration of a memory system in accordance with an embodiment of the present disclosure.

FIG. 14 is a block diagram illustrating a configuration of a memory system 1100 in accordance with an embodiment of the present disclosure.

Referring to FIG. 14, the memory system 1100 includes a memory device 1120 and a memory controller 1110.

The memory device 1120 may include a transmission line which overlaps a first memory cell array adjacent to input/output pads, and transmits a signal from a circuit group. The transmission line may be disposed between first metal source patterns overlapping the first memory cell array. The memory device 1120 may include a second metal source pattern which overlaps a second memory cell array spaced farther apart from the input/output pads than the first memory cell array, and is formed wider than each of the first metal source patterns.

The memory device 1120 may be a multi-chip package configured with a plurality of flash memory chips.

The memory controller 1110 controls the memory device 1120, and may include Static Random Access Memory (SRAM) 1111, a Central Processing Unit (CPU) 1112, a host interface 1113, an error correction block 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The error correction block 1114 detects and corrects an error included in a data read from the memory device 1120. The memory interface 1115 interfaces with the memory device 1120. The memory controller 1110 may further include Read Only Memory (ROM) for storing code data for interfacing with the host, and the like.

Figure 15:
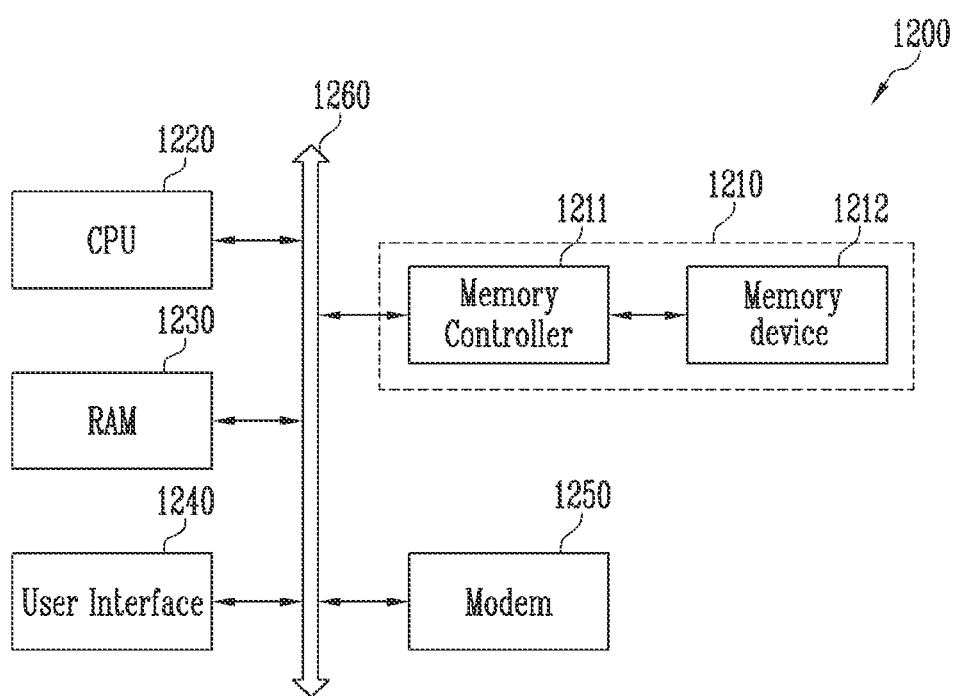
FIG. 15 is a block diagram illustrating a configuration of a computing system in accordance with an embodiment of the present disclosure.

FIG. 15 is a block diagram illustrating a configuration of a computing system 1200 in accordance with an embodiment of the present disclosure.

Referring to FIG. 15, the computing system 1200 in accordance with the embodiment of the present disclosure may include a CPU 1220, random access memory (RAM) 1230, a user interface 1240, a modem 1250, and a memory system 1210, which are electrically connected to a system bus 1260. The computing system 1200 may be a mobile device, for example.

The memory system 1210 may include a memory device 1212 and a memory controller 1211. The memory device 1212 may include a transmission line which overlaps a first memory cell array adjacent to input/output pads, and transmits a signal from a circuit group. The transmission line may be disposed between first metal source patterns overlapping the first memory cell array. The memory device 1212 may include a second metal source pattern which overlaps a second memory cell array spaced farther apart from the input/output pads than the first memory cell array, and is formed wider than each of the first metal source patterns.

In accordance with the present disclosure, the degree of arrangement freedom of an upper line layer can be improved by using a conductive material which is formed at a low temperature of 450° C. or lower and has a resistivity lower than that of silicon.

What is claimed is:
1. A semiconductor memory device comprising:
a bit line;
a common source line overlapping a portion of the bit line;
a gate stack structure including interlayer insulating layers and conductive patterns, which are alternately stacked between the bit line and the common source line;
a channel structure disposed in the gate stack structure, wherein the channel structure extends to be in direct contact with the common source line;
a memory pattern disposed between the channel structure and the gate stack structure; and
a circuit group including a transistor,
wherein the common source line includes a silicide layer,
wherein the silicide layer is in direct contact with an outer surface of an end portion of the channel structure,
wherein the bit line and the gate stack structure are disposed between the circuit group and the common source line, wherein the channel structure includes a first end portion and a second end portion, the second end portion facing the circuit group, the first end portion facing in a direction opposite to a direction of the second end portion, and wherein the first end portion of the channel structure includes the outer surface in direct contact with the silicide layer.

2. The semiconductor memory device of claim 1, wherein the common source line includes tungsten silicide or a nickel silicide, which is in direct contact with the channel structure.

3. A semiconductor memory device comprising:
a bit line;
a common source line overlapping a portion of the bit line;
a gate stack structure including interlayer insulating layers and conductive patterns, which are alternately stacked between the bit line and the common source line;
a channel structure disposed in the gate stack structure, wherein the channel structure extends to be in direct contact with the common source line;
a memory pattern disposed between the channel structure and the gate stack structure;
a bit line contact plug connecting the channel structure and the bit line;
a substrate overlapped by the gate stack structure, wherein the bit line interposed between the substrate and the gate stack structure;
a first interconnection structure disposed between the substrate and the bit line;
a second interconnection structure disposed between the first interconnection structure and the substrate;
a junction region defined in a partial region of the substrate, which is connected to the second interconnection structure, wherein the junction region includes an n-type or p-type impurity; and
bonding metals respectively connected to the first interconnection structure and the second interconnection structure, wherein the bonding metals are bonded to each other.

4. The semiconductor memory device of claim 1, further comprising:
a metal source pattern overlapping the common source line; and
a source contact plug connecting the metal source pattern and the common source line.

5. The semiconductor memory device of claim 1, wherein the silicide layer forms an ohmic contact with the channel structure.

* * * * *